US012664348B2

(12) United States Patent
Peng et al.

(10) Patent No.:    US 12,664,348 B2
(45) Date of Patent:        Jun. 23, 2026

(54) INTEGRATED CIRCUIT DEVICE AND MANUFACTURING METHOD OF THE SAME

(71) Applicant: TAIWAN SEMICONDUCTOR MANUFACTURING COMPANY, LTD., Hsinchu (TW)

(72) Inventors: Shih-Wei Peng, Hsinchu City (TW); Wei-Cheng Tzeng, Taipei City (TW); Wei-Cheng Lin, Taichung City (TW); Jiann-Tyng Tzeng, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 821 days.

(21) Appl. No.: 17/829,853

(22) Filed: Jun. 1, 2022

(65) Prior Publication Data

US 2023/0394216 A1    Dec. 7, 2023

(51) Int. Cl.
G06F 30/3953        (2020.01)
H10W 20/00        (2026.01)

(52) U.S. Cl.
CPC ...... G06F 30/3953 (2020.01); H10W 20/031 (2026.01)

(58) Field of Classification Search
None
See application file for complete search history.

(56) References Cited

U.S. PATENT DOCUMENTS

| | | | | |
|---|---|---|---|---|
| 8,863,048 | B1 * | 10/2014 | Gerousis | G06F 30/392 |
| | | | | 716/55 |
| 2013/0305196 | A1 * | 11/2013 | Chou | G06F 30/367 |
| | | | | 716/102 |
| 2015/0242561 | A1 * | 8/2015 | Sharma | G06F 30/3312 |
| | | | | 716/52 |
| 2015/0332960 | A1 * | 11/2015 | Chen | G06F 30/394 |
| | | | | 438/618 |
| 2017/0316140 | A1 * | 11/2017 | Kim | H10D 89/10 |
| 2018/0039723 | A1 * | 2/2018 | Lin | G06F 30/394 |
| 2019/0155981 | A1 * | 5/2019 | Biswas | G06F 30/394 |
| 2021/0224457 | A1 * | 7/2021 | Guo | G06F 30/392 |

* cited by examiner

*Primary Examiner* — Cory W Eskridge
(74) *Attorney, Agent, or Firm* — Birch, Stewart, Kolasch & Birch, LLP

(57)        ABSTRACT

A method is provided, including following operations: obtaining information on gate pitch and a ratio between the gate pitch and a first metal line pitch; comparing a preset metal line end spacing with a second metal line pitch, of multiple metal traces, and a spacing between a metal line layer and a power rail layer; in response to the comparison, defining multiple first metal line patterns overlapping multiple first gate patterns and defining multiple second metal line patterns disposed between two adjacent gate patterns in multiple second gate patterns; placing the first metal line patterns in a first row in a floorplan of an integrated circuit layout design and the second metal line patterns in a second row, adjacent the first row; and manufacturing at least one element in an integrated circuit based on the integrated circuit layout design.

20 Claims, 20 Drawing Sheets

300

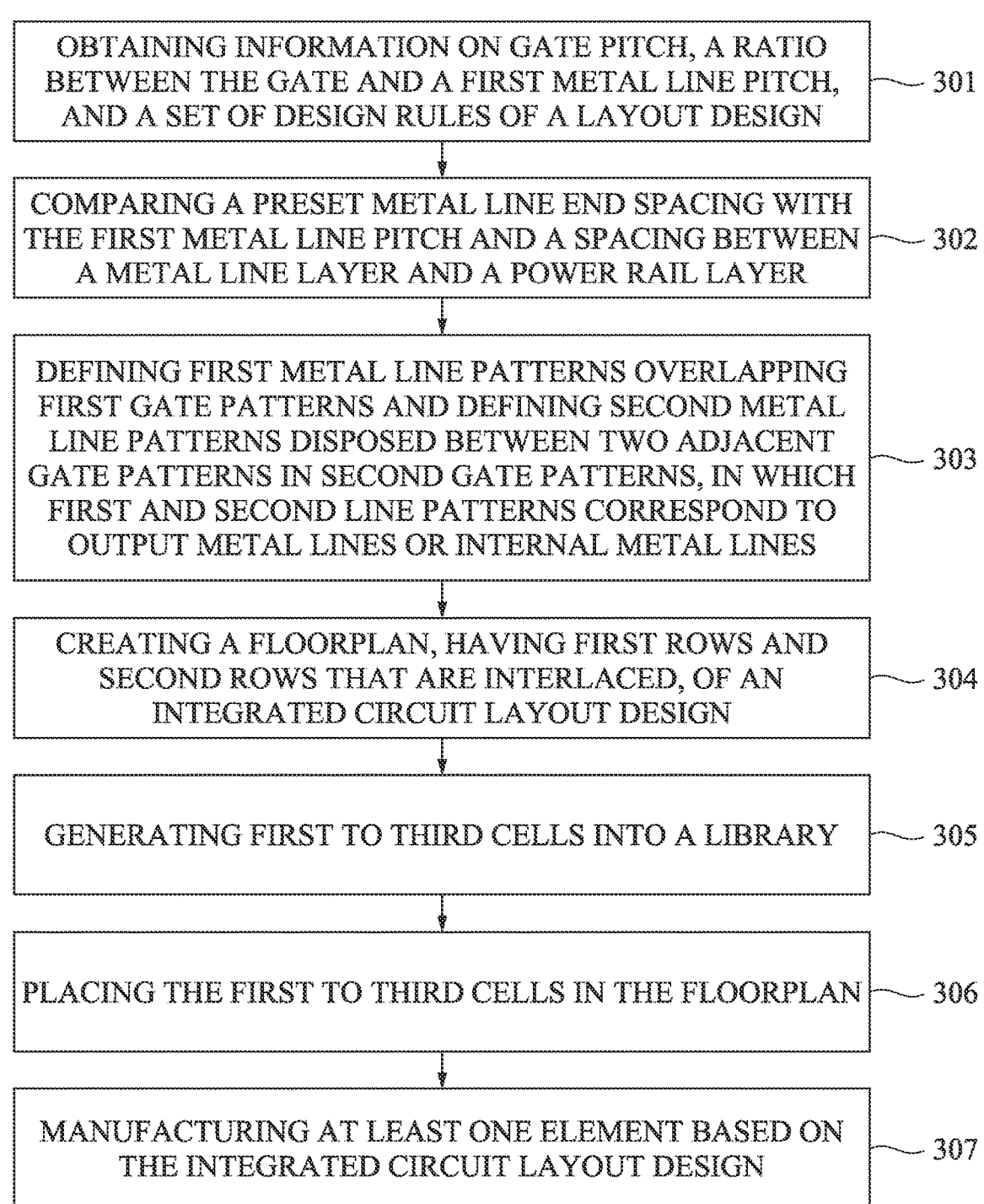

OBTAINING INFORMATION ON GATE PITCH, A RATIO BETWEEN THE GATE AND A FIRST METAL LINE PITCH, AND A SET OF DESIGN RULES OF A LAYOUT DESIGN — 301

COMPARING A PRESET METAL LINE END SPACING WITH THE FIRST METAL LINE PITCH AND A SPACING BETWEEN A METAL LINE LAYER AND A POWER RAIL LAYER — 302

DEFINING FIRST METAL LINE PATTERNS OVERLAPPING FIRST GATE PATTERNS AND DEFINING SECOND METAL LINE PATTERNS DISPOSED BETWEEN TWO ADJACENT GATE PATTERNS IN SECOND GATE PATTERNS, IN WHICH FIRST AND SECOND LINE PATTERNS CORRESPOND TO OUTPUT METAL LINES OR INTERNAL METAL LINES — 303

CREATING A FLOORPLAN, HAVING FIRST ROWS AND SECOND ROWS THAT ARE INTERLACED, OF AN INTEGRATED CIRCUIT LAYOUT DESIGN — 304

GENERATING FIRST TO THIRD CELLS INTO A LIBRARY — 305

PLACING THE FIRST TO THIRD CELLS IN THE FLOORPLAN — 306

MANUFACTURING AT LEAST ONE ELEMENT BASED ON THE INTEGRATED CIRCUIT LAYOUT DESIGN — 307

FIG. 3

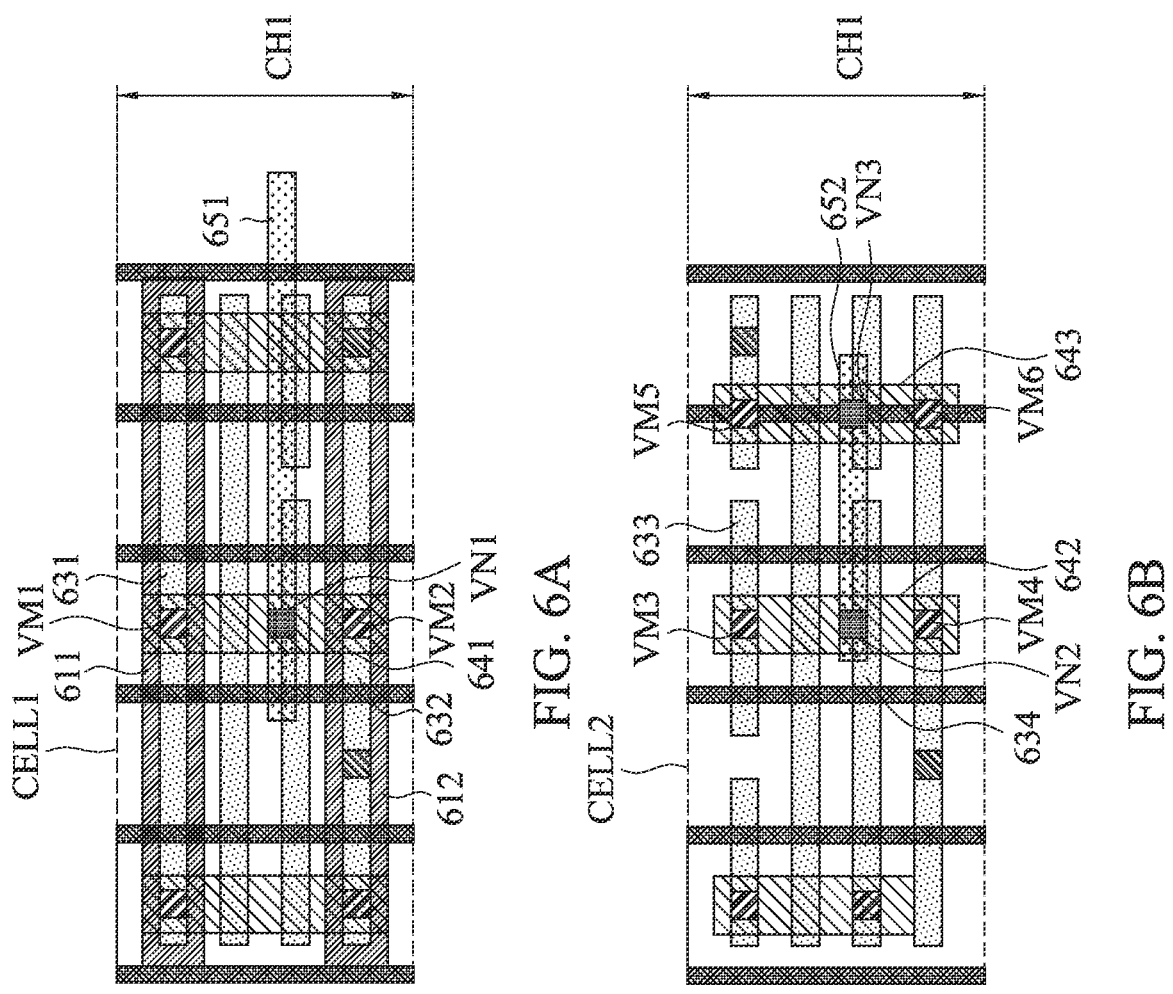

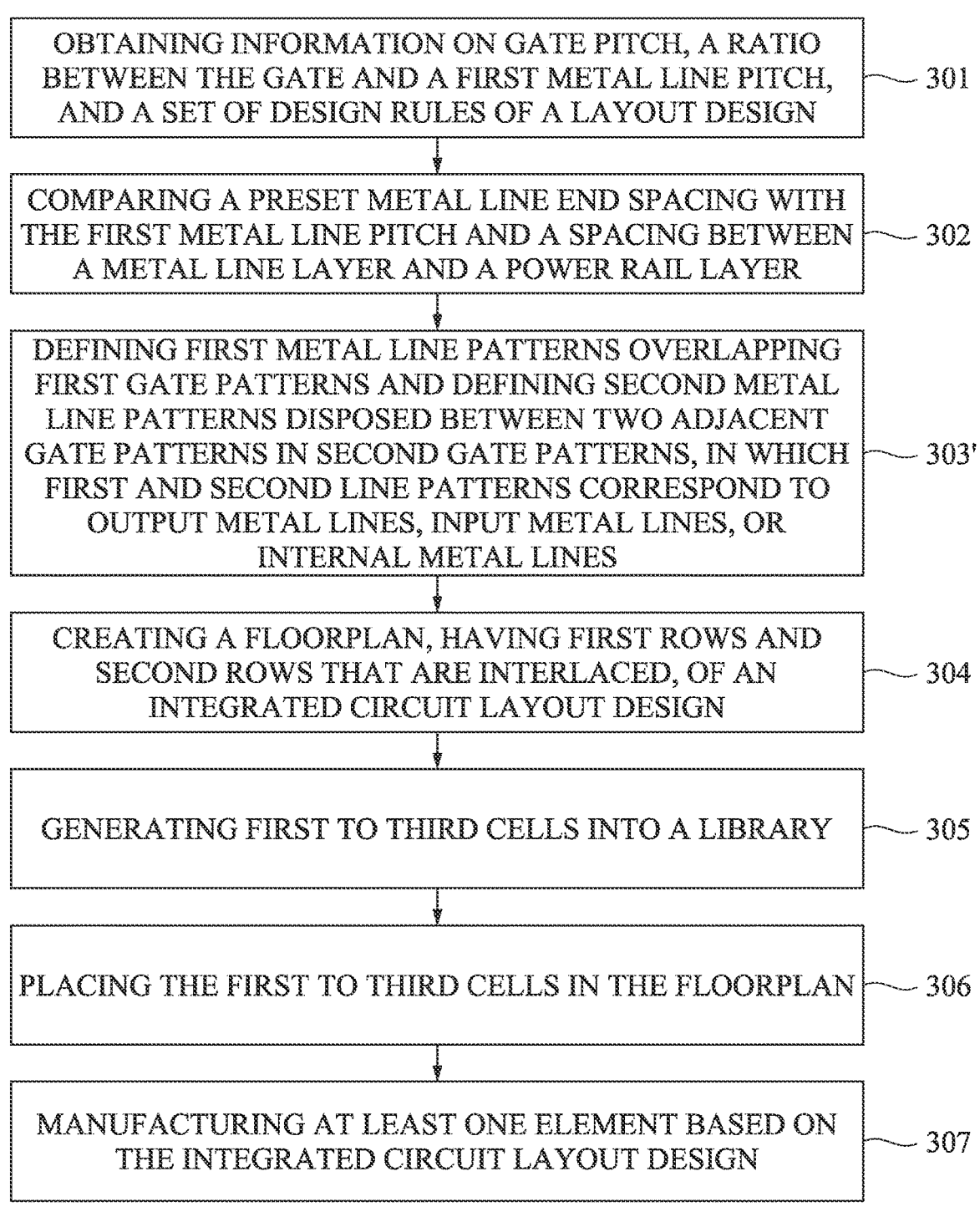

OBTAINING INFORMATION ON GATE PITCH, A RATIO BETWEEN THE GATE AND A FIRST METAL LINE PITCH, AND A SET OF DESIGN RULES OF A LAYOUT DESIGN — 301

COMPARING A PRESET METAL LINE END SPACING WITH THE FIRST METAL LINE PITCH AND A SPACING BETWEEN A METAL LINE LAYER AND A POWER RAIL LAYER — 302

DEFINING FIRST METAL LINE PATTERNS OVERLAPPING FIRST GATE PATTERNS AND DEFINING SECOND METAL LINE PATTERNS DISPOSED BETWEEN TWO ADJACENT GATE PATTERNS IN SECOND GATE PATTERNS, IN WHICH FIRST AND SECOND LINE PATTERNS CORRESPOND TO OUTPUT METAL LINES, INPUT METAL LINES, OR INTERNAL METAL LINES — 303'

CREATING A FLOORPLAN, HAVING FIRST ROWS AND SECOND ROWS THAT ARE INTERLACED, OF AN INTEGRATED CIRCUIT LAYOUT DESIGN — 304

GENERATING FIRST TO THIRD CELLS INTO A LIBRARY — 305

PLACING THE FIRST TO THIRD CELLS IN THE FLOORPLAN — 306

MANUFACTURING AT LEAST ONE ELEMENT BASED ON THE INTEGRATED CIRCUIT LAYOUT DESIGN — 307

FIG. 12

INTEGRATED CIRCUIT DEVICE AND MANUFACTURING METHOD OF THE SAME

BACKGROUND

Generally, electronic design automation (EDA) tools assist semiconductor designers to take a purely behavioral description of a desired circuit and work to fashion a finished layout of the circuit ready to be manufactured. For example, the use of standard cell libraries with automated placement and routing software tools in the EDA has developed to shorten the time required to design and verify a new integrated circuit. However, issues happen when structural designs reach the physical limitations of the manufacturing processes that will be used to turn the designs into the physical semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 is a flow chart of a method of manufacturing an integrated circuit, in accordance with some embodiments.

FIGS. 6A-6B are schematic diagrams of integrated circuits, in accordance with some embodiments.

FIG. 10 is a schematic diagram of a cell in an integrated circuit, in accordance with some embodiments.

FIG. 12 is a flow chart of a method of manufacturing an integrated circuit, in accordance with some embodiments.

DETAILED DESCRIPTION

Figure 1:
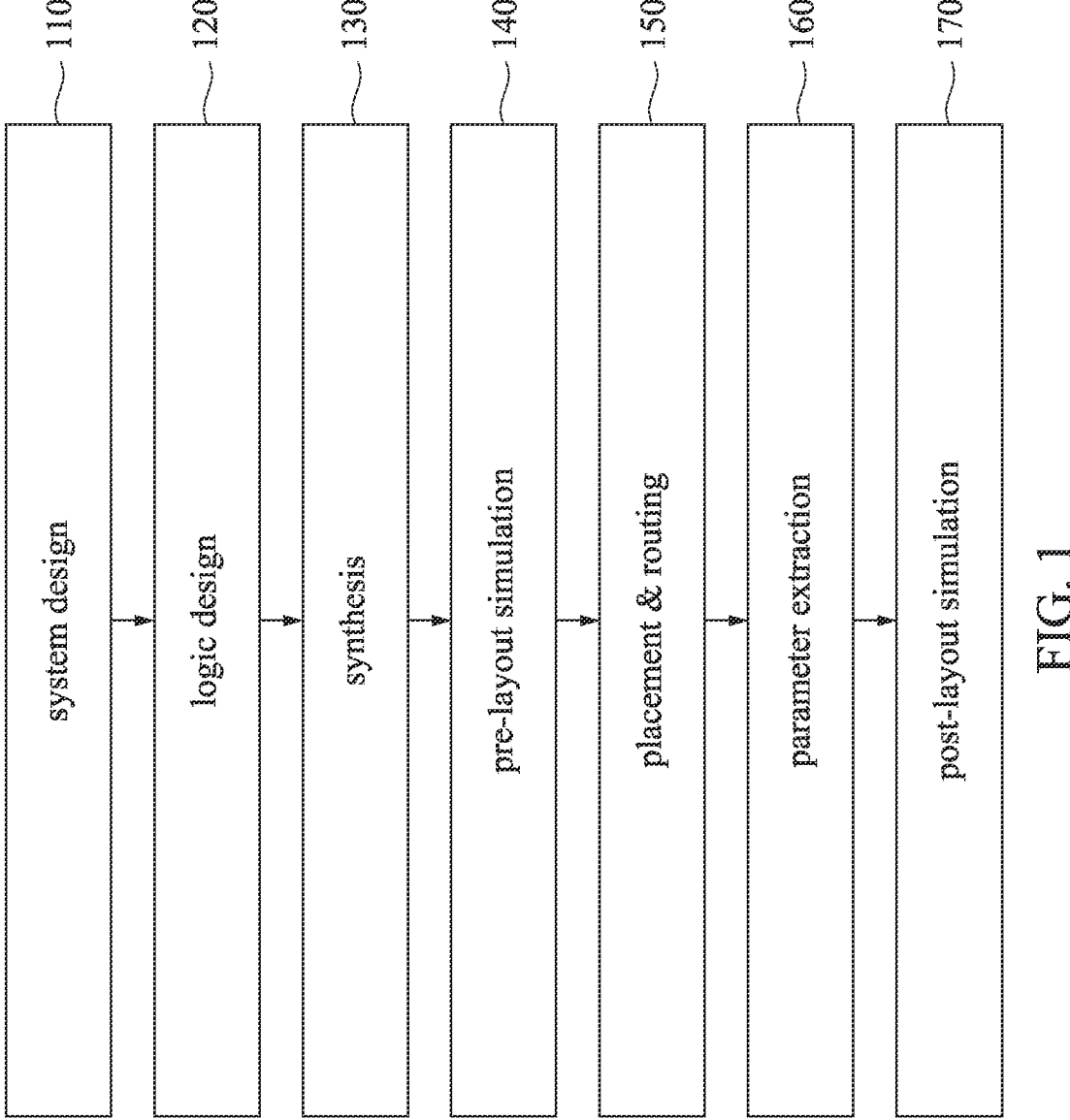
FIG. 1 is a schematic diagram illustrating a design flow, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the term "and/or" includes any and all combinations of one or more of the associated listed items.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

In some approaches for defining and placing the M1 metal lines between two adjacent cells, the opposite M1 metal lines having lengths longer than the cell height have risks to be electrically short with each other. Accordingly, in some embodiments of the present disclosure, method with the set of design rules are provided for defining and placing M1 metal lines that are manufactured by two different masks and assigned to different rows in the floorplan of the integrated circuit layout design. By utilizing the methods of the present disclosure, the M1 metal lines are staggered and fulfilled the set of design rules for better M1 metal line and cell placement.

Reference is now made to FIG. 1. FIG. 1 is a schematic diagram illustrating a design flow 100, in accordance with some embodiments. The design flow 100, employed for designing semiconductor chips, utilizes one or more electronic design automation (EDA) tools, for example, the EDA system 1900 in FIG. 19, to facilitate design operations. A workstation or personal computer is used in executing the tools to accomplish the design flow 100. The design flow 100 comprises a system design stage 110, a logic design stage 120, a synthesis stage 130, a pre-layout simulation stage 140, a placement and routing stage 150, a parameter extraction stage 160 and a post-layout simulation stage 170.

Initially, at the system design stage 110, a systematic architecture for the chip of interest is provided with a high level description. In that stage, each function of the chip along with performance requirements is determined according to a design specification. Those functions are usually represented by respective schematic functional modules or blocks. In addition, an optimization or performance trade-off may be sought in order to achieve the design specification with affordable cost and power.

At the logic design stage 120, the functional modules or blocks are described in a register transfer level (RTL) using a hardware description language. The language tools are usually available from commercial software, for example, Verilog or VHDL. A preliminary functionality check is performed at the logic design stage 120 to verify if the implemented functions conform to the specification set forth in the system design stage 110.

Subsequently, at the synthesis stage 130, the modules in RTL descriptions are converted into a netlist data where circuit structure, for example, logic gates and registers, in each function module are established. Mapping of such logic gates and registers to available cells in a standard cell library may be conducted. Further, the netlist data is offered to describe the functional relationship of the chip devices in a gate-level. The netlist data is transformed from the gate-level view to a transistor-level view. The term "netlist" used herein refers to both graphical-based representation such as a schematic and/or a text-based representation of a circuit.

Then, the gate-level netlist data is verified at the pre-layout simulation stage 140. At the verification process of the stage 140, if some of the functions fail the verification in the simulation, the design flow 100 may be paused temporarily and go back to the stages 110 or 120 for further correction or modification. After the pre-layout simulation stage 140, the IC chip design has passed a preliminary verification and completed the front-end design process. Subsequently, a back-end physical design process will follow.

At the placement and routing stage 150, a physical architecture representing the circuits determined during the front-end process is implemented. The detailed structure and associated geometry of each component and device are determined in the placement operation, and interconnects among different components are routed subsequent to the placement operation. Moreover, the placement operation involves deciding where to place each IC chip component and circuitry in a limited amount of space, and the routing operation decides the actual wiring of connecting lines. Both operations of placement and routing are performed to meet a design rule check (DRC) deck, such as from the chip manufacturing facility, so as to fulfill the manufacturing criteria of the chip. After the placement and routing stage 150, a placed-and-routed layout data is created and a netlist with placement and routing data is generated accordingly.

At the parameter extraction stage 160, a layout parameter extraction (LPE) operation is conducted to derive layout-dependent parameters, such as parasitic resistance and capacitance, resulting from a developed layout at the stage 150. In some embodiments, before the layout parameter extraction operation, a layout-versus-schematic (LVS) verification is performed to check the functional performance of the chip in terms of the placed-and-routed netlist. Consequently, a post-layout netlist data is then generated, which includes the layout-dependent parameters.

At the post-layout simulation stage 170, a physical verification is performed by taking the parameters acquired in previous stages into account. At the stage 170, a simulation of transistor-level behavior is conducted in order to examine whether the chip performs the desired functionality within the required system specification. Moreover, the post-layout simulation is performed to ensure no presence of electrical issues or lithographic issues in the chip manufacturing process.

After the post-layout simulation stage 170, it is determined whether the post-layout netlist fulfills the design specification. If affirmative, the circuit design is accepted and then signed off accordingly. However, if the result of the post-layout simulation is unfavorable, the design flow 100 would loop back to previous stages for functionality or performance tuning. For example, the design flow 100 may loop back to the placement and routing stage 150 where the layout is re-developed so as to fix issues from the layout level. Alternatively, the design flow 100 may retreat to earlier stages; either the system design stage 110 or the logic design stage 120 in order to recast the chip design in case the problems cannot be resolved in the back-end stage.

The design flow 100 illustrated in FIG. 1 is exemplary. Other sequences of the stages or operations, partition of the stages, or additional stages before, between or after the stages shown still fall within the contemplated scope of the present disclosure.

In advanced semiconductor fabrications, for example, the 2-nanometer (N2) node, metal lines in the metal-1 (M1) metal line layer extend in parallel with (metal) gates and serve as pin access metals for electrical contact with corresponding gates. The ratio of the distance between immediately adjacent gates (hereinafter the "gate pitch") to the distance between immediately adjacent M1 lines (hereinafter the "metal line pitch" or "M1 metal line pitch") is greater than 1. For example, the ratio is raised from 1:1 to 2:1, 3:2 or 4:3. Moreover, in some embodiments, in the N2 node, when the ratio is 2:1 and the gate pitch is about 48 nanometers, the M1 metal line pitch is about 24 nanometer that is closer to the metal line pitch of metal lines in the metal-0 (M0) metal line layer below the M1 metal line layer in the 3-nanometer (N3) node. Alternatively stated, patterning (or multi-patterning) processes encompass a group of techniques and methods used in the N3 node have been developed to allow for imaging of M1 metal line patterns with ratio of 2:1, without applying more expensive approaches or non-applicable approaches.

Figure 2A:
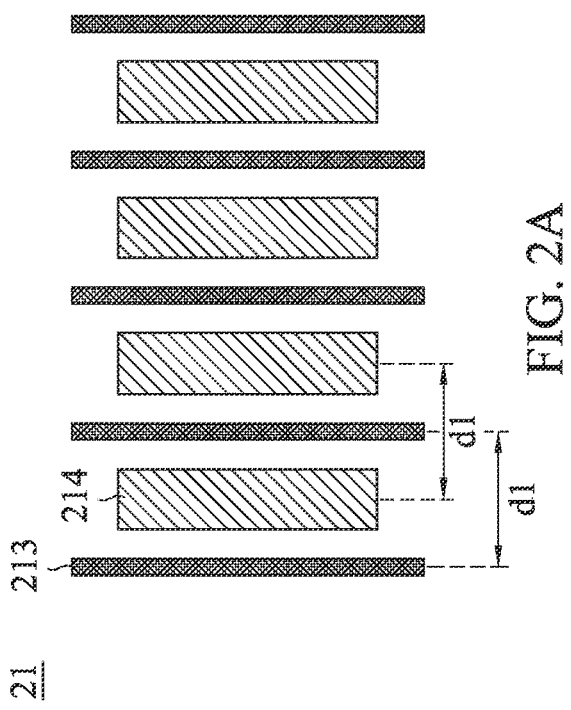
FIGS. 2A and 2B are schematic diagrams illustrating semiconductor structures having different ratios between gate pitch and metal-1 (M1) metal line pitch, in accordance with some embodiments.
Figure 2B:
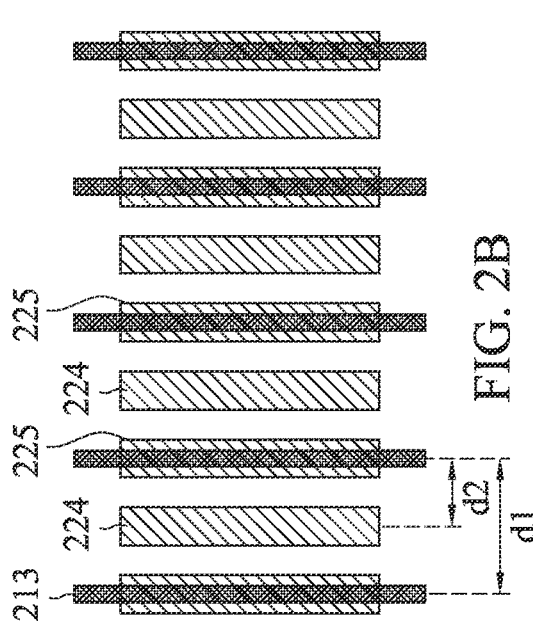

Reference is now made to FIGS. 2A-2B. FIGS. 2A and 2B are schematic diagrams illustrating semiconductor structures having different ratios between gate pitch and metal-1 (M1) metal line pitch, in accordance with some embodiments. Specifically, FIG. 2A shows a ratio of 1:1 and FIG. 2B shows an exemplary ratio of 2:1.

Referring to FIG. 2A, gates 213 extend in parallel with each other in a first direction and are separate from each other by a gate pitch d1. Further, metal lines 214 in the M1 metal line layer also extend in parallel with each other in the first direction and are separate from each other by a metal pitch. In some embodiments, the metal lines 214 in M1 metal line layer are electrically coupled to at least one of the gates 213 through conductive vias and serve as pin accesses for the gates 213. In some embodiments, the gate pitch is a center-to-center distance between two immediately adjacent gates 213 in a second direction substantially orthogonal to the first direction. Also, the M1 metal line pitch is a center-to-center distance between two immediately adjacent metal lines 214 in the second direction. Moreover, the value of the gate pitch d1 is generally a natural number. In the present embodiment, the ratio of gate pitch to M1 metal line pitch is 1:1. Accordingly, the M1 metal line pitch is d1. Gate pitch may also be referred to as poly pitch when polysilicon is used as gate material. Nevertheless, gate material may be selected from other conductive materials including, for example, tantalum (Ta), tantalum nitride (TaN), niobium (Nb) and tungsten nitride/ruthenium oxide (WN/RuO2).

Referring to FIG. 213, since the ratio is raised to 2:1, M1 metal line pitch d2 is smaller than the gate pitch d1. In some embodiments, the M1 metal line pitch d2 is half of the gate pitch d1. Accordingly, in the embodiments of the ratio of 2:1, one of the metal lines 224 disposed between two other M1 metal line 225 is also referred to as disposed between two immediately adjacent gates 213, as shown in FIG. 2B, in which the two other M1 metal line 225 overlap the two immediately adjacent gates 213 in a layout view.

Reference is now made to FIG. 3. FIG. 3 is a flow chart of a method 300 of manufacturing an integrated circuit, in accordance with some embodiments. It is understood that additional operations can be provided before, during, and after the processes shown by FIG. 3, and some of the operations described below can be replaced or eliminated, for additional embodiments of the method. The order of the operations/processes may be interchangeable. Throughout the various views and illustrative embodiments, like reference numbers are used to designate like elements. The method 300 includes operations 301-307 that are described below with reference to the cells in integrated circuits in FIGS. 4A-11, an electronic design automation (EDA) system 1900 in FIG. 19 and a manufacturing system 2000 in FIG. 20. In some embodiments, the method 300 is performed by the processor 1902 in the EDA system 1900.

In operation 301, information on gate pitch, a ratio between the gate and a M1 metal line pitch, and a set of design rules of a layout design is obtained. For example, as discussed in the embodiments of FIGS. 2A-2B, the ratios are 1:1 and 2:1 respectively, which will be described in detail. In some embodiments, the set of design rules provide relevant spacing and sizing information for the layout design of cells in the integrated circuit, configuration of placement of cells in a floorplan including, for example, parameters M1 metal line pitch M1P, M0 metal line pitch M0P, spacing between two adjacent M0 metal lines, a width M0W of the M0 metal line, metal line end spacing (e.g., of the M1 metal lines) M1E, width PW of the power rails, spacing SP between ends of the M1 metal lines, row heights of rows in the floorplan of the integrated circuit, etc. In some embodiments, the M0 metal lines are referred to as metal traces disposed in a layer below the M1 metal layer.

In some embodiments, the set of design rules include a cell height of a standard cell smaller than a threshold cell height, for example, about 110 nanometers, and the gate pitch is larger than a threshold gate pitch, for example, about 44 nanometers.

Figures 4A, 4B, 4C:
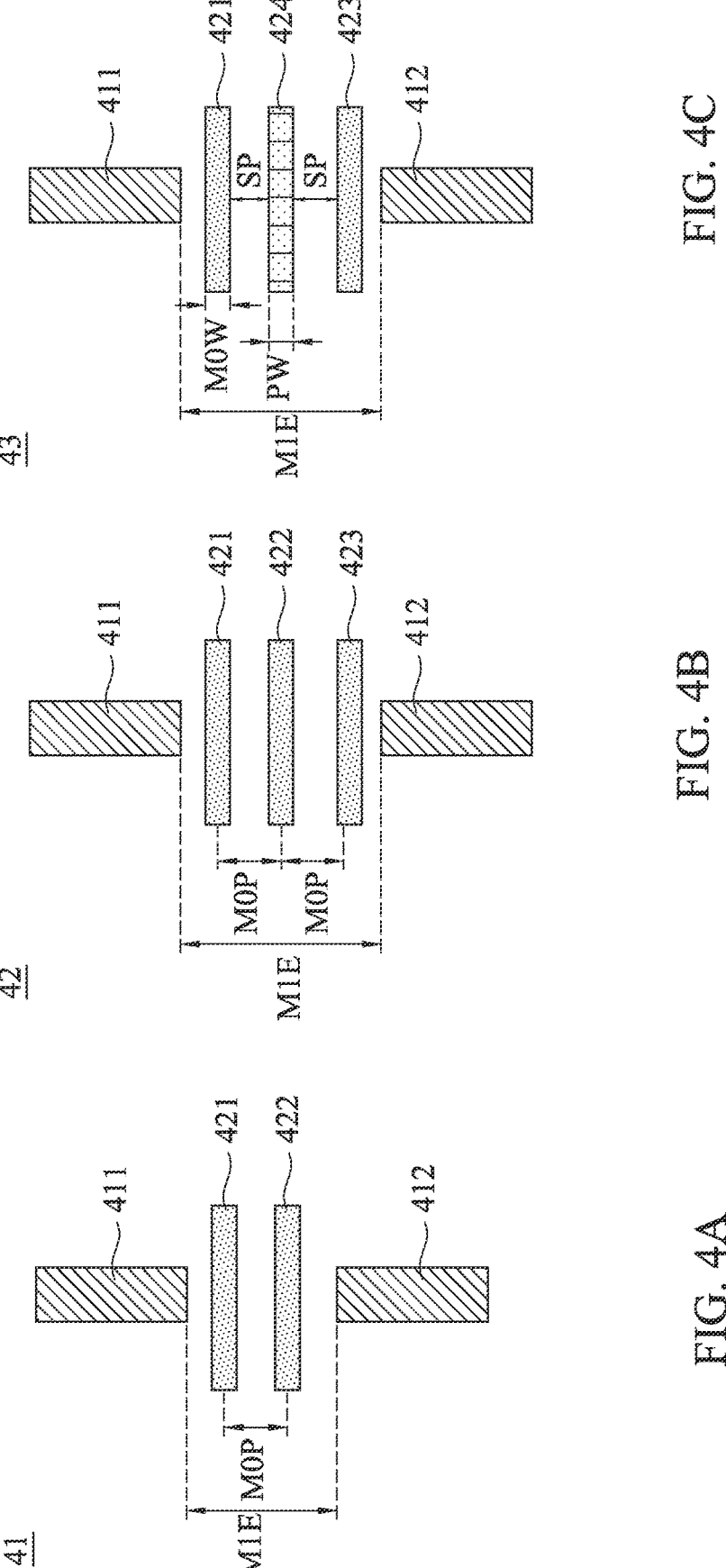
FIGS. 4A-4C are schematic diagrams of integrated circuits, in accordance with some embodiments.

In operation 302, with reference to FIGS. 4A-4C, a preset metal line end spacing, for example, M1E, is compared with the M0 metal line pitch M0P of the M0 metal lines 421-422 and a spacing between a metal line layer, for example, M1 metal lines 411-412 and a power rail layer 424. For example, as shown in FIG. 4A, the set of design rules include the preset metal line end spacing M1E that is referred to as the minimum spacing between the opposing ends of two adjacent M1 metal lines 411-412 and greater than the M0 metal line pitch M0P. In another embodiment, the set of design rules include the preset metal line end spacing M1E greater than a distance double of the M0 metal line pitch M0P, as shown in FIG. 4B. In the other embodiment as shown in FIG. 4C, the set of design rules include the preset metal line end spacing M1E greater than a distance expressed by (PW+M0P+SP), in which (PW+M0P+SP) equals to (PW+(M0W+SP)+SP) or (PW+(0.5M0W+0.5M0W)+SP+SP.) In some embodiments, the preset metal line end spacing M1E corresponds to a process parameter of an etch process (for example, multiple double patenting process by extreme ultraviolet lithography (EUV)). Alternatively stated, when the set of design rules are fulfilled, the operation 303 is performed.

Figure 5:
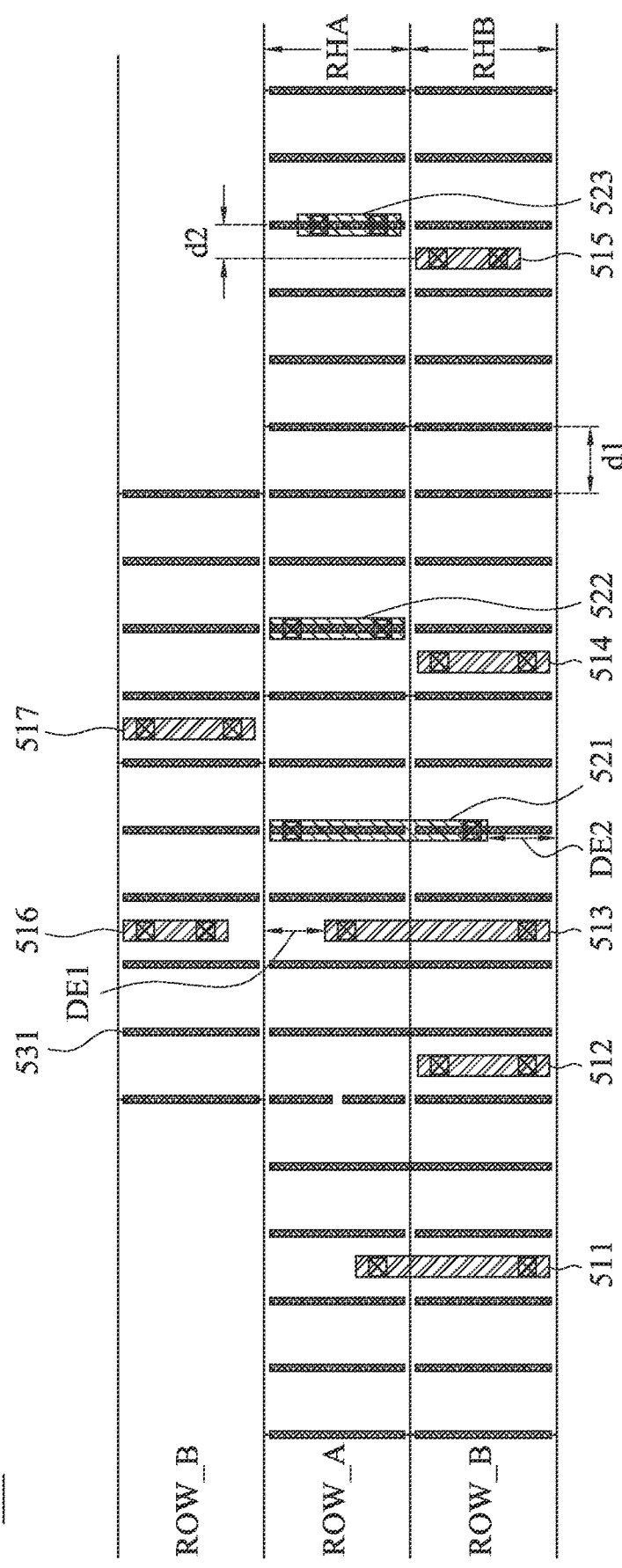
FIG. 5 is a schematic diagram of a floorplan corresponding to an integrated circuit, in accordance with some embodiments.

In operation 303, as shown in FIG. 5, M1 metal line patterns 521-523 are defined to overlap gate patterns 531 in a row ROW_B and M1 metal line patterns 511-517 are defined to be disposed between two adjacent gate patterns 531 in rows ROW_A. Furthermore, the gate pitch of the gates 531 is d1 and the M1 metal line pitch of two closest the M1 metal line patterns, for example, 515 and 523, is d2 that is half of d1. The ratio of gate pitch and the M1 metal line pitch is 2:1.

In some embodiments, M1 metal line 521 is defined to be in the row ROW_A and to have a length large than the row height RHA of the row ROW_A, as shown in FIG. 5. In various embodiments, M1 metal line pattern 513 is defined to be in the row ROW_B and to have a length large than the row height RHB of the row ROW_B, as shown in FIG. 5. Accordingly, the set of design rules include a metal line end spacing M1EA corresponding to a process parameter of forming the M1 metal line pattern 521 and a metal line end spacing M1EB corresponding to a process parameter of forming the M1 metal line pattern 513. In some embodiments, the metal line end spacing M1EA and M1EB are configured with respect to, for example, the metal line end spacing M1E mentioned above. Accordingly, in order to avoid electrical short between two opposite M1 metal lines in a same gate pitch, for example, the M1 metal line patterns 513 and 516 on FIG. 5, for a cell including a M1 metal line configured with respect the M1 metal line 513, a distance DE1 between the end of said M1 metal line in the row ROW_A and the boundary of the row ROW_A should be at least equal or larger than the metal line end spacing M1EB. Similarly, for a cell including a M1 metal line configured with respect the M1 metal line 521, a distance DE2 between the end of said M1 metal line in the row ROW_B and the boundary of the row ROW_B should be at least equal or larger than the metal line end spacing M1EA. In some embodiments, the metal line end spacings M1EA and M1EB are different from each other.

In some embodiments, the M1 metal line patterns 521-523 and the M1 metal line patterns 511-517 correspond to output metal lines or internal metal lines as shown in FIGS. 6A-6B. The output metal lines are configured to, for example, output signals from the cell, and the internal metal lines are configured to, for example, transmit signals between structures in the cell. Specifically, a M1 metal line is identified as an output metal line when it (1) is at least coupled to a pair of N-type and P-type active areas (e.g., oxide diffusion, OD), (2) is coupled to at least two M0 metal lines through two vias and/or coupled to a M2 metal line, disposed in a layer above the M1 metal layer through a via, and (3) has length shorter than about 1.1 times of a cell height of a standard cell where said M1 metal line is within. For example, as shown in the embodiments of FIG. 6A, the M1 metal line 641 is coupled to the M0 metal lines 631-632 through the vias VM1-VM2, in which the M0 metal lines 631-632 are connected conductive segments (e.g., metal-on-device, MD, not shown) that are electrically coupled to the active areas 611-612. The M1 metal line 641 couples the M2 metal line 651 through the via VN1, and has a length smaller than the cell height CH1 of the cell CELL1.

In some embodiments, a M1 metal line is identified as an internal metal line when it (1) is coupled to at least two M0 metal lines through two vias and/or (2) coupled to another M1 metal line in the same cell through a via and a M2 metal line. For example, as shown in the embodiments of FIG. 6B, the M1 metal line 642 is coupled to the M0 metal lines 633-634 through the vias VM3-VM4, and further coupled to the M1 metal line 643 through the via VN2, the M2 metal line 652, and the via VN3. The M1 metal line 643 is identified as an internal metal line as it couples another two M0 metal lines through vias VM5-VM6.

Figure 11:
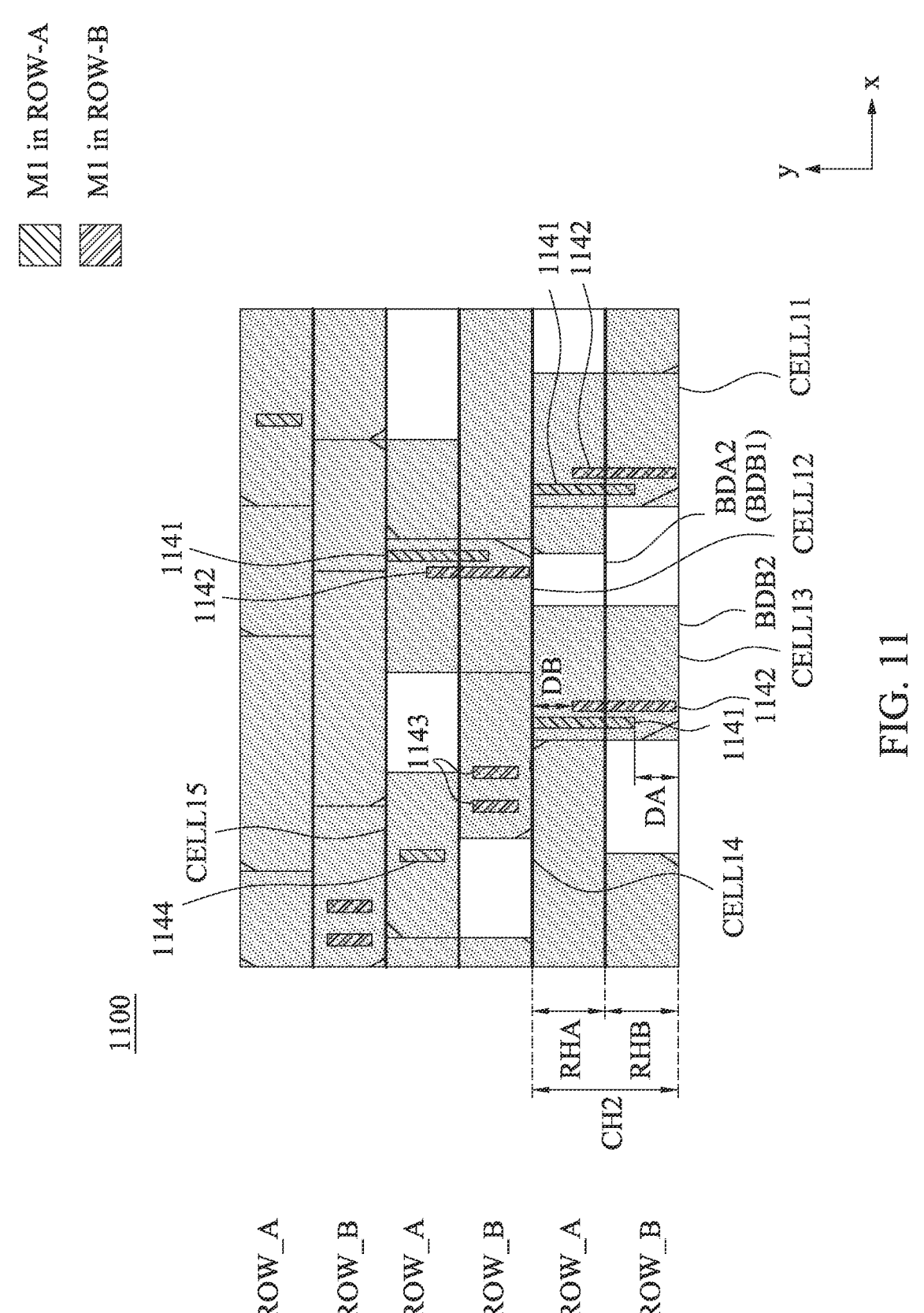
FIG. 11 is a schematic diagram of an integrated circuit, in accordance with some embodiments.

In operation 304, a floorplan, as shown in FIG. 5 or in FIG. 11, having rows ROW_A and rows ROW_B that are interlaced with each other, of an integrated circuit (i.e., chip) layout design is created.

In operation 305, multiple cells (layout diagrams) are generated based on the set of design rules and stored in the library of IC layout diagrams (e.g., 1920 in FIG. 19) of the EDA system for further application. For example, patterns of M2 metal lines, M1 metal lines, M0 metal line, gates, active areas, conductive segments (MD), vias, etc., are assign to specific cell for implementing logic circuits in the integrated circuits, as shown in the layout diagrams of cells in FIGS. 7A-10, and are placed in the rows ROW_A and ROW_B of the floorplan in operation 306 applying the set of design rules.

Figures 7A, 7B:
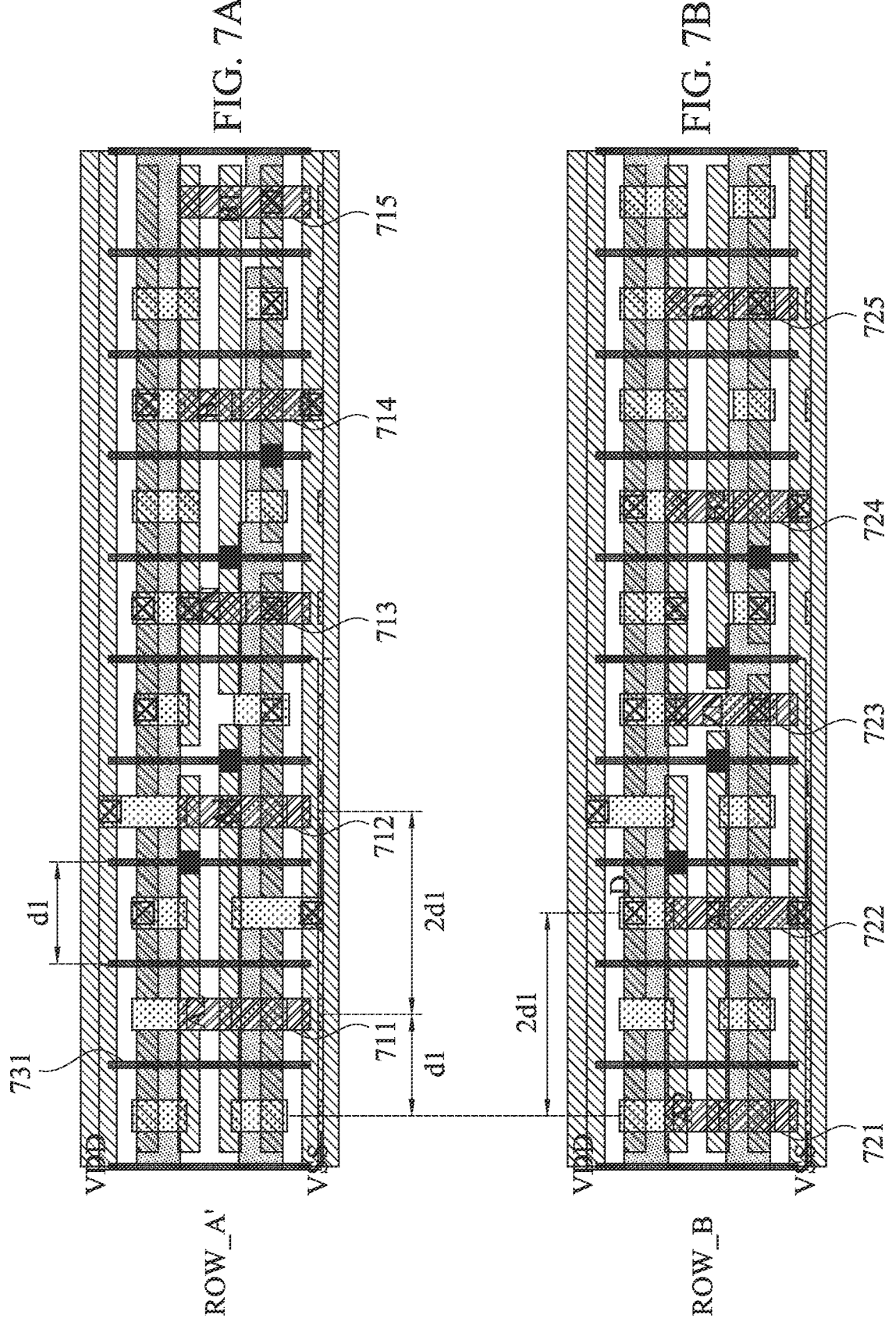
FIGS. 7A-7B are schematic diagrams of integrated circuits, in accordance with some embodiments.

In some embodiments, when the ratio between the gate pitch and M1 metal line pitch is 1:1, the set of design rules include placing M1 metal lines in a row by separating M1 metal lines by a distance 2 times greater than the M1 metal line pitch. For example, as shown in FIGS. 7A-7B, the M1 metal line pitch (e.g., between the M1 metal lines 711 and 721) and gate pitch are equal to d1. M1 metal lines 711-715 are placed in a row ROW_A' and separated with each other by a distance 2d1, and M1 metal lines 721-725 are placed in a row ROW_B' and separated with each other by the distance 2d1 while the M1 metal lines 711-715 and 721-725 are arranged between gates 731.

In some embodiments, the set of design rules include none of the M1 metal line patterns, for example, the M1 metal lines 521-523 that overlap gate patterns, in the cell placed in the row ROW_B and none of the M1 metal line patterns, for example, the M1 metal lines 511-517 arranged between gate patterns, in the cell placed in the row ROW_A. Alternatively stated, the M1 metal line patterns overlapping gate patterns are placed in certain rows, for example, the rows ROW_A, and the M1 metal line patterns arranged between gate patterns are placed in other rows, for example, the rows ROW_B. the embodiments fulfill the set of design rules are given in FIGS. 8A-9B, and will be described in the following paragraphs.

Figures 8A, 8B:
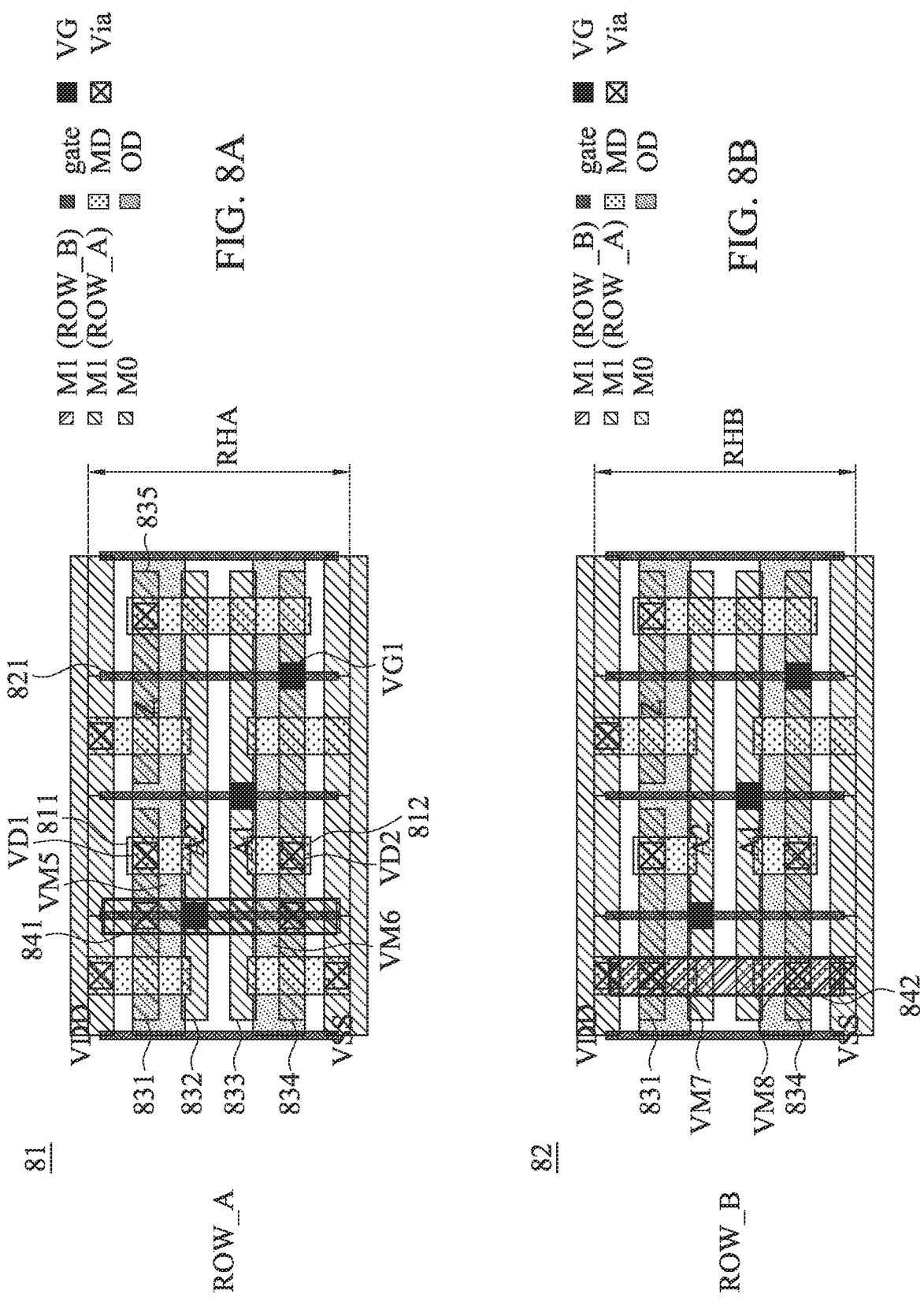
FIGS. 8A-8B are schematic diagrams of cells in integrated circuits, in accordance with some embodiments.

Reference is now made to FIGS. 8A-8B, FIGS. 8A-8B are schematic diagrams of cells in integrated circuits, in accordance with some embodiments. In some embodiments, each of the cells 81-82 of integrated circuits in FIGS. 8A-8B corresponds to an AND gate circuit having two input terminals to receive signals A1-A2 and an output terminal Z for generating an output signal. Typically, the AND gate circuit includes 3 P-type transistors and 3 N-type transistor, in which one P-type transistor and one N-type transistor form an inverter having an output terminal as the output terminal of the AND gate circuit, other two P-type transistors are coupled between an input terminal of the inverter and a first supply voltage terminal and receive signals A1-A2 at its gate respectively, and other two N-type transistors are coupled in series between the input terminal of the inverter and a second supply voltage and receive signals A1-A2 at its gate respectively.

As illustratively shown in FIG. 8A, the cell 81, having a cell height equal to the row height of the row ROW_A, is placed in the row ROW_A and includes a M1 metal line 841 overlapping a gate. The M0 metal line 832-833 receives the signals A1-A2 for the cell 81. The M1 metal line 841 corresponds to an internal metal line of the cell 81 while it is coupled to the conductive segment 811 through the via VD1, the M0 metal line 831, and the via VM5 and coupled to the conductive segment 812 through the via VM6, the M0 metal line 834, and the via VD2. The conductive segments 811-812 correspond to the drains of P-type and N-type transistors, in the AND gate circuit, coupled to the input terminal of the inverter. The M0 metal line 835 corresponds to the output terminal of the AND gate circuit.

Compared with FIG. 8A, instead of placing the M1 metal line on the gate, the cell 82, having a cell height equal to the row height of the row ROW_B, is placed in the row ROW_B and includes a M1 metal line 842 arranged between gates and overlapping conductive segments (MD). Specifically, the M1 metal line 842 is coupled to the conductive segment 811 through the via VD1, the M0 metal line 831, and the via VM7 and coupled to the conductive segment 812 through the via VM8, the M0 metal line 834, and the via VD2. In some embodiments, the row height of the row ROW_A and the row height of the row ROW_B are different from each other, and the row height of the row ROW_A is greater. In various embodiments, the row height of the row ROW_A and the row height of the row ROW_B are the same.

Figures 9A, 9B:
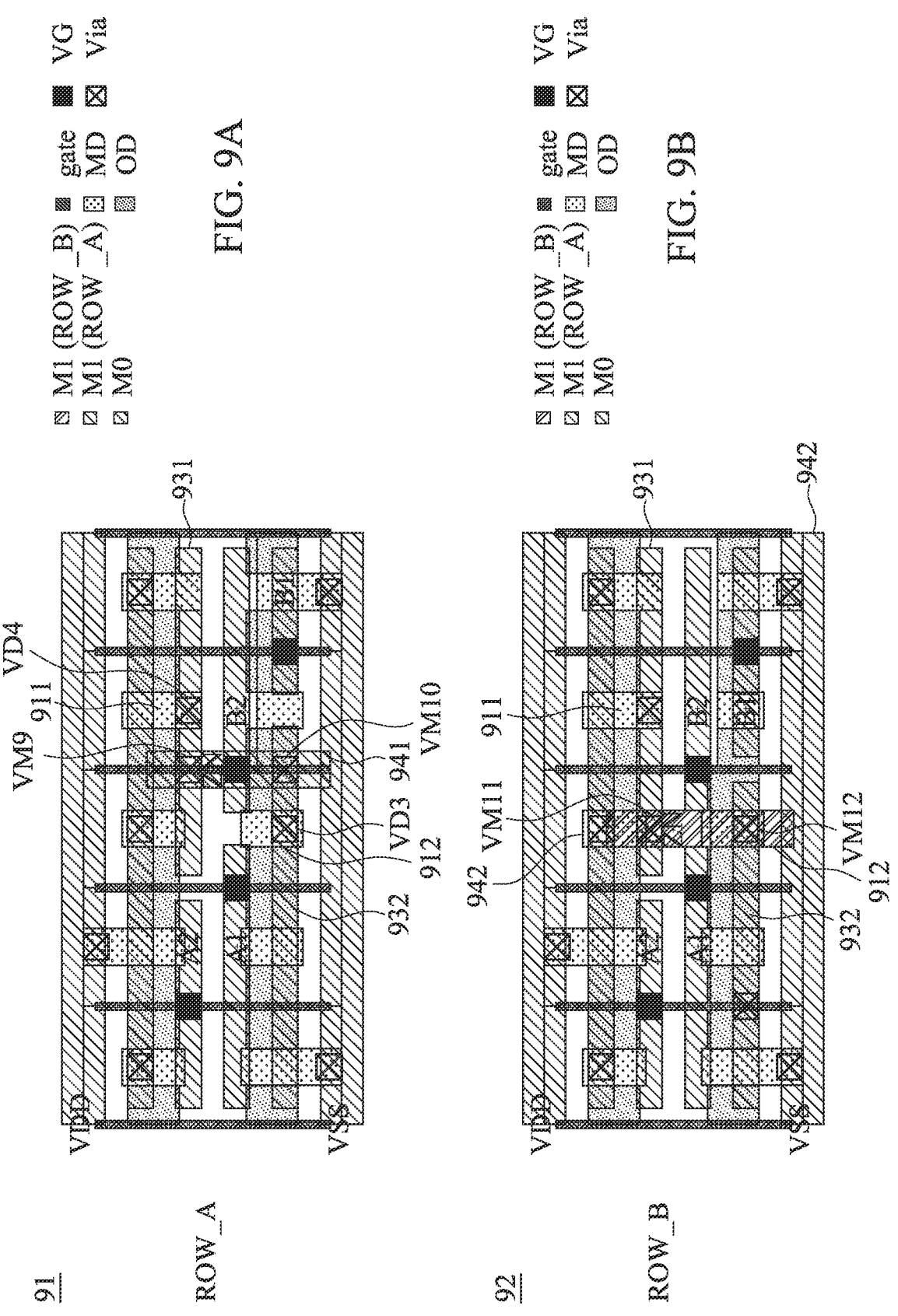
FIGS. 9A-9B are schematic diagrams of cells in integrated circuits, in accordance with some embodiments.

Reference is now made to FIGS. 9A-9B, FIGS. 9A-9B are schematic diagrams of integrated circuits, in accordance with some embodiments. In some embodiments, each of the cells 91-92 of integrated circuits in FIGS. 9A-9B corresponds to an AOI22 logic circuit having four input terminals to receive signals A1-A2, B1-B2 and an output terminal Z for generating an output signal. Typically, the AOI22 logic circuit includes four P-type transistors coupled between a first supply voltage terminal and an output terminal Z and four N-type transistors coupled between a second supply voltage terminal (or ground) and the output terminal Z. Specifically, the first pair of two P-type transistors are coupled in parallel between a node and the first supply voltage terminal and receive signals A1-A2 at their gates. The second pair of two P-type transistors are coupled in parallel between the node and the output terminal Z and receive signals B1-B2 at their gates. The first pair of two N-type transistors are coupled in series and receive signals A1-A2 at their gates. The second pair of two N-type transistors are coupled in series with each other and in parallel with the first pair of N-type transistors and receive signals B1-B2 at their gates.

As illustratively shown in FIG. 9A, the cell 91, having a cell height equal to the row height of the row ROW_A, is placed in the row ROW_A and includes a M1 metal line 941 overlapping a gate. The M1 metal line 941 is referred to as an output metal line corresponding to the output terminal of the cell 91. Specifically, the conductive segment 911, corresponding to drains of the second pair of the P-type transistors in the AOI22 logic circuit, is coupled to the M1 metal line 941 through the via VD4, the M0 metal line 931, and the via VM9. The conductive segment 912, corresponding to drains of N-type transistors, coupled to the output terminal Z, in the first and second pairs of the N-type transistors in the AOI22 logic circuit, is coupled to the M1 metal line 941 through the via VD3, the M0 metal line 932, and the via VM10.

Compared with FIG. 9A, instead of placing the M1 metal line on the gate, the cell 92, having a cell height equal to the row height of the row ROW_B, is placed in the row ROW_B and includes a M1 metal line 942 arranged between gates and overlapping at least the conductive segment 912. Specifically, the conductive segment 911 is coupled to the M1 metal line 942 through the via VD4, the M0 metal line 931, and the via VM11. The conductive segment 912 is coupled to the M1 metal line 942 through the via VD3, the M0 metal line 932, and the via VM12.

Figure 10:
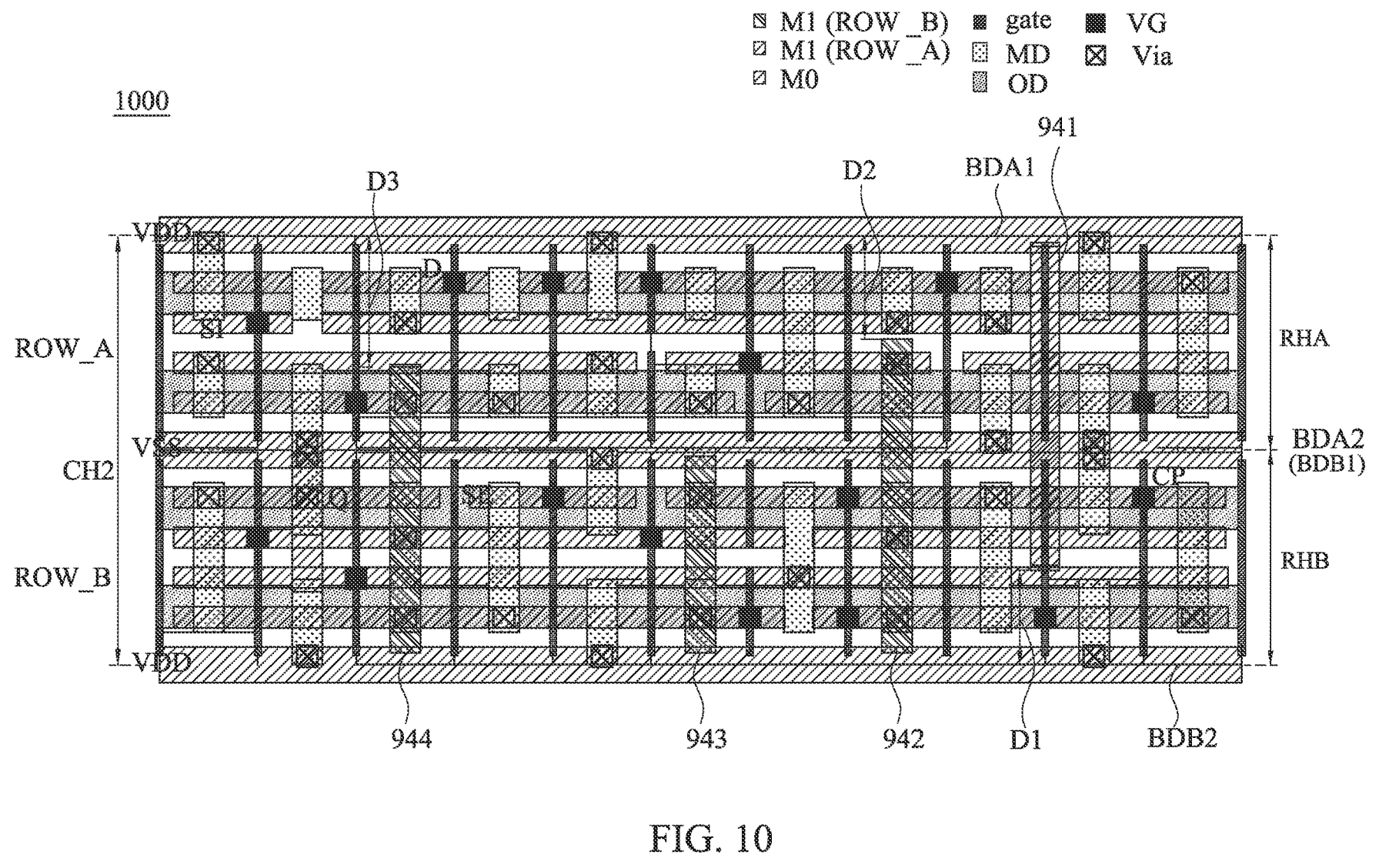

As shown in FIG. 10, in some embodiments, a cell 1000 having a cell height CH2 equal to double of cell height CH1 is placed in both the rows ROW_A and ROW_B. The cell 1000 corresponds to a scan flip-flop circuit that receives a scan data input SI, a data input D and a scan enable signal SE and a clock signal CP1 for generating an output data signal Q.

For illustration, the cell 1000 includes M1 metal lines 941-944. The M1 metal line 941 is placed in the row ROW_A, overlaps gates, and extends from a boundary BDA1 of the row ROW_A to a boundary BDB2 of the row ROW_B while a boundary BDA2 of the row ROW_A passes across the M1 metal line 941. The boundary BDB1 of the row ROW_B overlaps the boundary BDA2. Specifically, the end of the M1 metal line 941 in the row ROW_B is apart from the boundary BDB2 by a distance D1 at least equal or larger than the metal line end spacing M1EA as described in FIG. 5. Similarly, for the M1 metal lines 942 and 944 are placed in the row ROW_B, interposed between gates, and extend from boundary BDB2 to the boundary BDA1 while the boundary BDA2 passes across the M1 metal lines 942 and 944. Specifically, the ends of the M1 metal lines 942 and 944 in the row ROW_A are apart from the boundary BDA1 by distances D2 and D3, respectively, at least equal or larger than the metal line end spacing M1EB as described in FIG. 5.

With continued reference to FIG. 3, in operation 307, at least one element is manufactured based on the floorplan of the integrated circuit layout design including, for example, the cells in FIGS. 5-11.

In some embodiments, the method 300 further include forming the M1 metal lines, for example, the M1 metal lines 521-523, placed in the row ROW_A by a first mask and forming the M1 metal lines, for example, the M1 metal lines 511-517, placed in the row ROW_B by a second mask.

Reference is now made to FIG. 11. FIG. 11 is a schematic diagram of an integrated circuit 1100, in accordance with some embodiments. The M1 metal lines 1141 and 1144, configured with respect to the M1 metal lines 521-523 in FIG. 5, in the rows ROW_A are formed by a first mask, and the M1 metal lines 1142 and 1143 in the rows ROW_B, configured with respect to the M1 metal lines 511-517 in FIG. 5, are formed by a second mask. The M1 metal line pitch of the M1 metal lines 1141-1143 is half of a gate pitch of the integrated circuit 1100.

For illustration, the M1 metal line 1141 is apart from a boundary of the ROW_B by a distance DA that is larger or equal to the metal line end spacing M1EA. The M1 metal line 1142 is apart from a boundary of the ROW_A by a distance DB that is larger or equal to the metal line end spacing M1EB. In some embodiments, the metal line end spacing M1EB, for example, about 25 nanometers, is smaller than the metal line end spacing M1EA, for example, about 40 nanometers.

In some embodiments as shown in FIG. 11, for the cell having the cell height CH2 and placed in both the rows ROW_A and ROW-B, the set of design rules include forbiddance to duplicate the cell by flipping the cell, for example, cells CELL11-CELL13, in y direction. For instance, there will be no opposite M1 metal lines 1141 of the cells arranged in adjacent rows, and accordingly, short between the M1 metal lines 1141 is prevented.

Figures 17A, 17B:
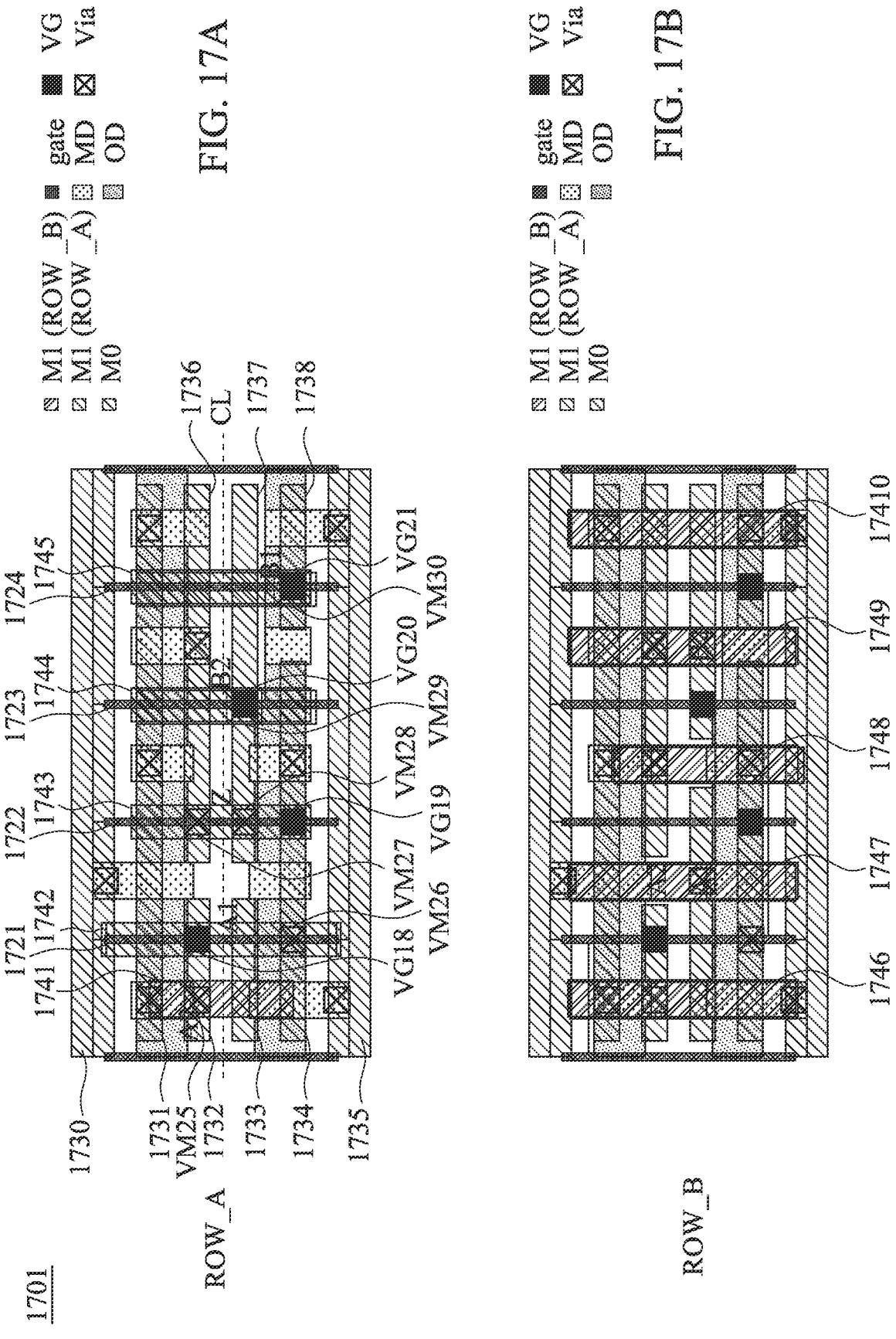
FIGS. 17A-17B are schematic diagrams of cells in integrated circuits, in accordance with some embodiments.
Figure 18:
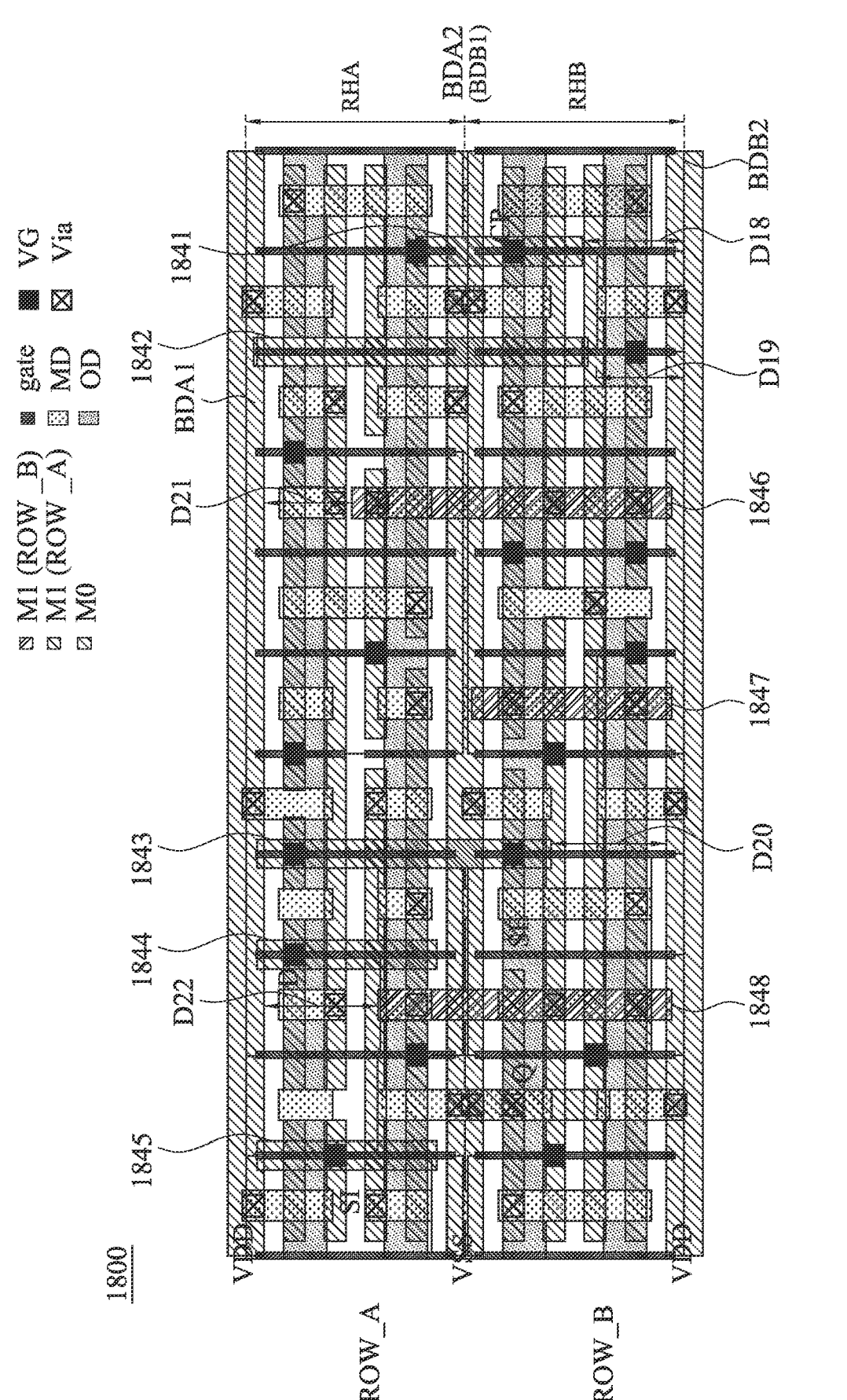
FIG. 18 is a schematic diagram of a cell in an integrated circuit, in accordance with some embodiments.

In addition, an integrated circuit layout design, as shown in FIG. 11, can include a combinations of the cells, as shown in FIGS. 7A-9B and further in FIGS. 17A-17B, having the cell height equal to the row height RHA or RHB and cells having the cell height CH2 as shown in FIGS. 10 and 18.

The configurations of FIGS. 1-11 are given for illustrative purposes. Various implements are within the contemplated scope of the present disclosure. For example, in some embodiments, inter-cell signal routing for the cells in FIGS. 5A-11 are designed by the EDA tools, for example, the EDA system 1900 in FIG. 19, to avoid the design rule violation (DRV). In various embodiments, when access points for routing is less than 3, more M1 metal lines are assigned to the cell.

Reference is now made to FIG. 12. FIG. 12 is a flow chart of a method 300' of manufacturing an integrated circuit, in accordance with some embodiments. For the sake of simplicity, the specific operations, which are already discussed in detail in above paragraphs, are omitted herein, unless there is a need to introduce the operations in FIG. 12.

Figure 13:
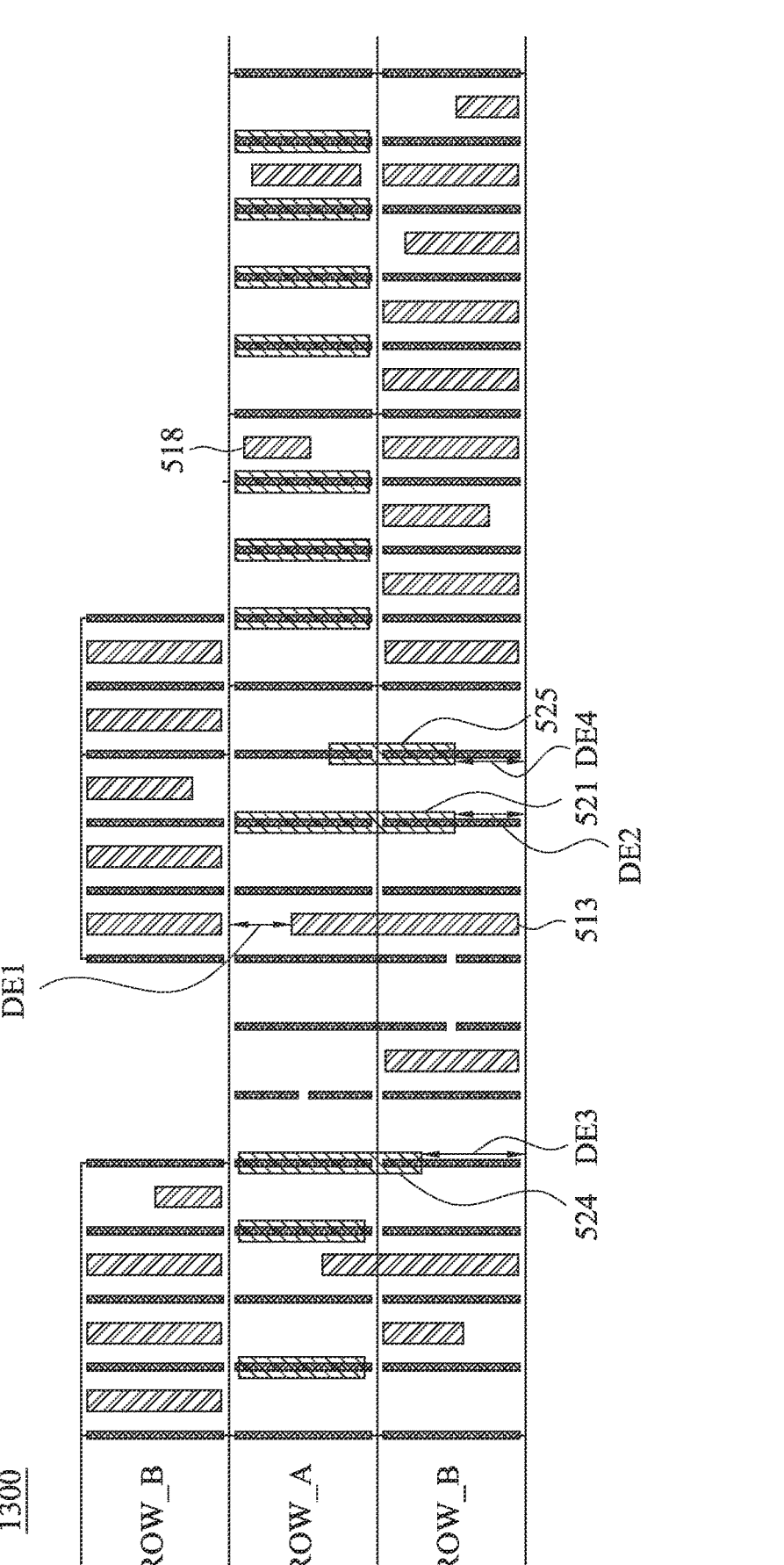
FIG. 13 is a schematic diagram of a floorplan corresponding to an integrated circuit, in accordance with some embodiments.
Figure 14:
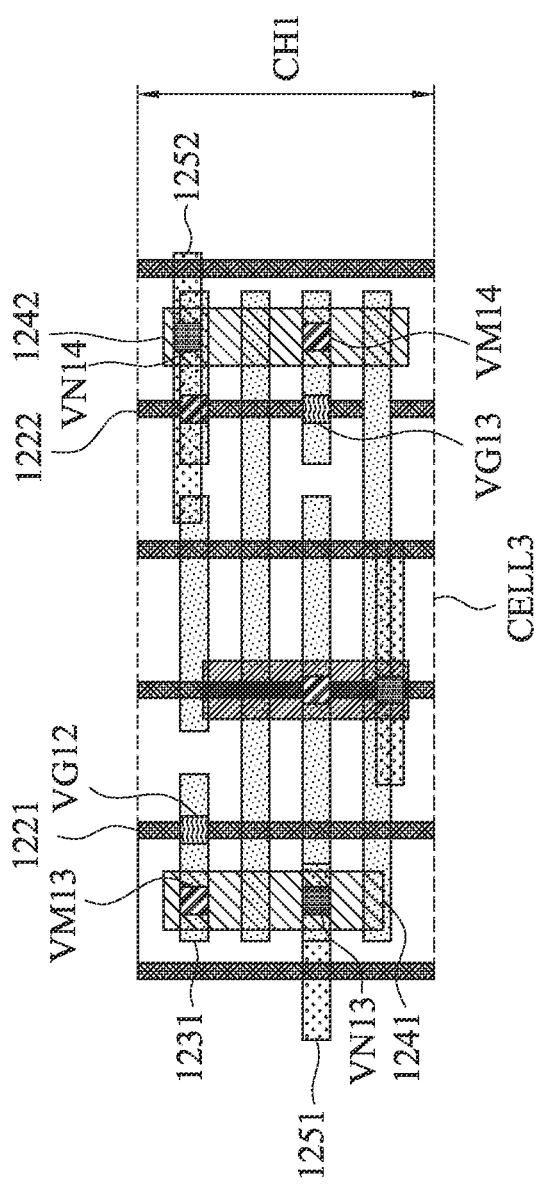
FIG. 14 is schematic diagram of an integrated circuit, in accordance with some embodiments.

Compared with the method 300 in FIG. 3, instead of having the operation 303, the method 300' includes the operation 303' in which the M1 metal lines (e.g., referred to as input metal lines) further correspond to metal lines configured to receive signals for the cell(s), such like the M1 metal lines in FIGS. 13-14. Specifically, a M1 metal line is identified as an input metal line when it (1) is at least coupled to at least one gate through a M0 metal line and a gate via, (2) is coupled to a M2 metal lines through a via, and (3) has length shorter than about 1.1 times of a cell height of a standard cell where said M1 metal line is within. For example, as shown in the embodiments of FIG. 14, the M1 metal line 1241 is coupled to the gate 1221 through the M0 metal line 1231, the via VM13 and the gate via VG12, and further coupled to the M2 metal line 1251 through the via VN13. Similarly, the M1 metal line 1242 is coupled to the gate 1222 through the M0 metal line 1232, the via VM14 and the gate via VG13, and further coupled to the M2 metal line 1252 through the via VN14. The M1 metal lines 1241-1242 have lengths smaller than the cell height CH1. For example, as shown in FIGS. 15A-15B, the cells 1501-1502 correspond to the AND gate circuit, and the M1 metal lines 1522-1523, 1546-1547 correspond to input metal line while the M2 metal lines are omitted in figured for simplicity and can be coupled to suitable positions of the M1 metal lines according to the routing design.

Figures 15A, 15B:
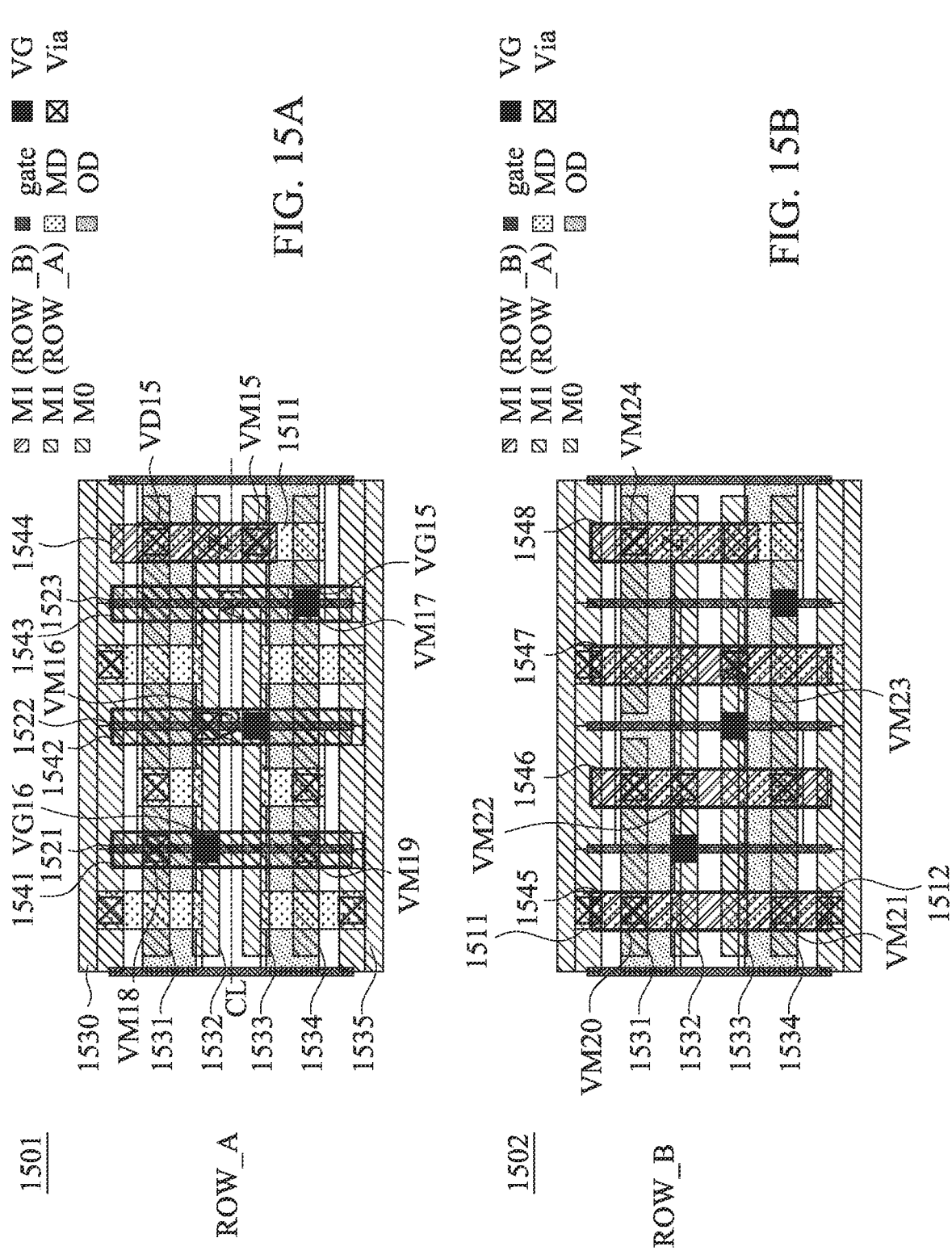
FIGS. 15A-15B are schematic diagrams of cells in integrated circuits, in accordance with some embodiments.

In addition, as discussion in FIGS. 15A-15B, M1 metal lines corresponding to the output metal lines and the internal metal lines are assigned to the cells as well. For example, the M1 metal lines 1541 and 1545 correspond to the internal metal lines. The M1 metal lines 1544 and 1548 correspond to the output metal lines, in which associated design rules for the M1 metal line 1544 will be described in the following paragraphs.

In some embodiments, the method 300' further includes operations of defining M1 metal lines, for example, the M1 metal line 518 in FIG. 5, with respect to the M1 metal lines 511-517. For example, the M1 metal lines 511-518 are formed by the same mask in the same manufacture process. The method 300' also includes operations of placing the M1 metal line 518 in the row ROW_A different from where other M1 metal lines 511-517, formed in the same process, are placed. Furthermore, as shown in FIG. 5, the M1 metal line 518 is apart from a boundary of the row ROW_A by a distance, and the set of design rules include said distance being smaller than the metal line end spacing M1EB.

In operation 305 of the method 300', the M1 metal line (e.g., configured with respect to M1 metal lines in the ROW_B) is further assigned to a cell in the ROW_A in generating the cell. For example, as shown in FIG. 15A, the cell 1501 includes the M1 metal line 1544 that is configured with respect to M1 metal lines in row ROW_B. Specifically, the M1 metal line 1544 corresponds to the output terminal Z. In some embodiments, when the aforementioned M1 metal line corresponds to an output terminal of the integrated circuit and is referred to as an output metal line, the set of design rules further include placing coupling M1 metal line, for example, the M1 metal line 1544, to the M0 metal line (e.g., the M0 metal line 1533) that is closer to a central line CL of the cell 1501, compared to those (e.g., the M0 metal lines 1530-1531 and 1534-1535) closer to boundaries of the row ROW_A.

Figure 16:
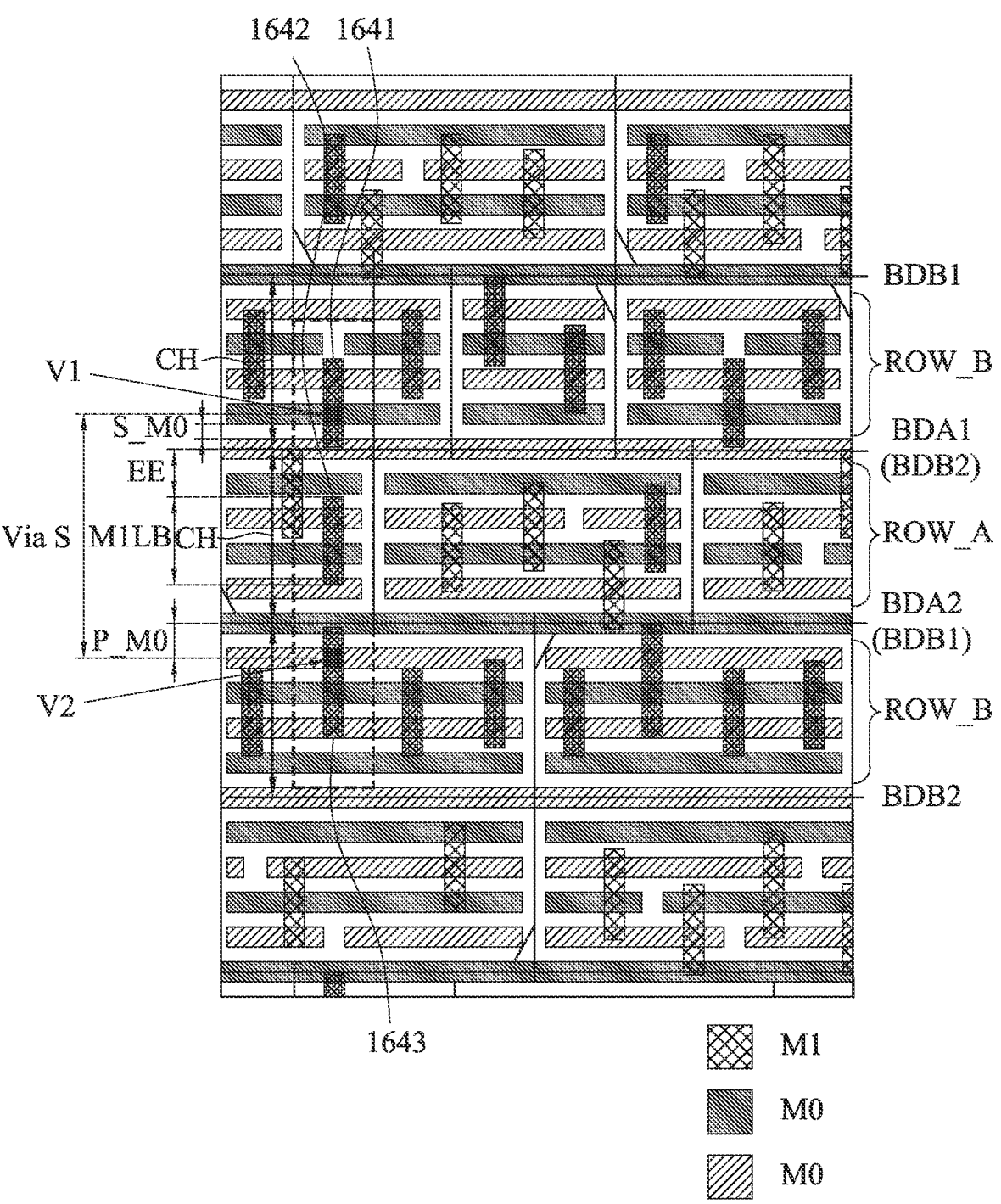
FIG. 16 is a schematic diagram of an integrated circuit, in accordance with some embodiments.

Furthermore, the set of design rules, in order to avoid short between opposite M1 metal lines, further include the cell height CH, the minimum length M1LB of the M1 metal line, the pitch P_M0 of the M0 metal line (e.g., metal trace), spacing S_M0 of the M0 metal line, and the metal line end spacing EE of the M1 metal line for the M1 metal line that is configured with respect to M1 metal lines in the ROW_B and assigned to the cell in the row ROW_A. For example, as shown in FIG. 16, the M1 metal lines 1641-1643 circled by the dash line are arranged in a same gate pitch and configured with respect to, for example, the M1 metal line 511-518. Specifically, the M1 metal lines 1641 and 1643 are placed in the rows ROW_B and the M1 metal line 1642 is placed in the row ROW_A. The M1 metal line 1642 is configured with respect to, for example, the M1 metal line 1544 in FIG. 15A, and placed between the M1 metal lines in the rows ROW_B. The rows ROW_A a ROW_B have the same row height RH which satisfies mathematical relationship (1) and (2):

$$3 \times RH > 3 \times M1LB + 4 \times EE \tag{1}$$

$$RH + P\_M0 + S\_M0 \geq M1LB + 2 \times EE \tag{2}$$

In which (RH+P_M0+S_M0) corresponds to a distance between an output pin V1 coupled to the M1 metal line 1641 and an output pin V2 coupled to the M1 metal line 1643. Alternatively stated, the placement of the middle M1 metal line among three M1 metal line in the same gate pitch, for example, 1642 should follow the set of design rules discussed above. In some embodiments, the minimum length M1LB of the M1 metal line is about 40 nanometers.

Reference is now made to FIGS. 17A-17B. FIGS. 17A-17B are schematic diagrams of cells in integrated circuits, in accordance with some embodiments. The cells 1701-1702 correspond to the AOI22 logic circuit as shown in FIGS. 9A-9B and are generated by the method 300'. Specifically, the M1 metal line 1741 is configured with respect to the M1 metal line 1642 in FIG. 16 and arranged in the row ROW_A. The M1 metal line 1741 is further coupled to a M0 metal line 1732 that is close to the central line CL of the cell 1701 through the vias VM25.

Reference is now made to FIG. 18. FIG. 18 is a schematic diagram of a cell in an integrated circuit, in accordance with some embodiments. As shown in FIG. 18, in some embodiments, a cell 1800 having a cell height CH2 equal to double of cell height CH1 is placed in both the rows ROW_A and ROW_B. The cell 1800 corresponds to the scan flip-flop circuit as discussed in FIG. 10.

For illustration, the cell 1800 includes M1 metal lines 1841-1848. The M1 metal lines 1841-1845 are placed in the row ROW_A and overlap gates. The M1 metal lines 1841-1843 extend from the boundary BDA1 to the boundary BDB2 while the boundary BDA2 passes across the M1 metal lines 1841-1843. Ends of the M1 metal lines 1841-1843 in the row ROW_B are apart from the boundary BDB2 by distances D18-D20 separately at least equal or larger than the metal line end spacing M1EA as described in FIGS. 5 and 13. Similarly, for the M1 metal lines 1846-1848 are placed in the row ROW_B, interposed between gates, and the M1 metal lines 1846 and 1848 extend from boundary BDB2 to the boundary BDA1 while the boundary BDA2 passes across the M1 metal lines 1846 and 1848. Specifically, the ends of the M1 metal lines 1846 and 1848 in the row ROW_A are apart from the boundary BDA1 by distances D21 and D22, respectively, at least equal or larger than the metal line end spacing M1EB as described in FIGS. 5 and 13.

Figure 19:
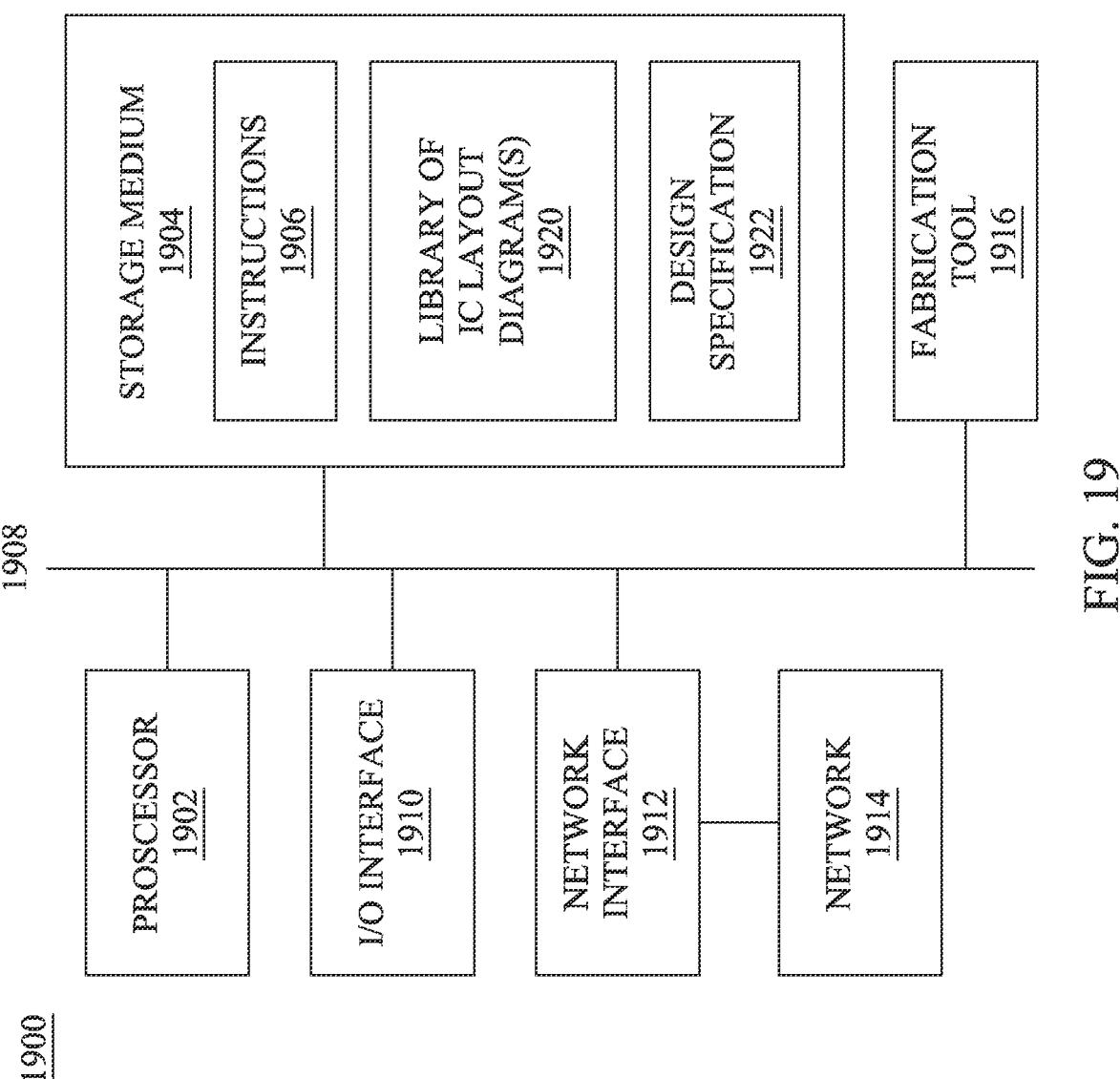
FIG. 19 is a block diagram of a system for designing an integrated circuit layout design, in accordance with some embodiments of the present disclosure.

Reference is now made to FIG. 19. FIG. 19 is a block diagram of an electronic design automation (EDA) system 1900 for designing the integrated circuit layout design, in accordance with some embodiments of the present disclosure. EDA system 1900 is configured to implement one or more operations of the methods 300 and 300' disclosed in FIGS. 3 and 12 and further explained in conjunction with FIGS. 1-18. In some embodiments, EDA system 1900 includes an APR system.

In some embodiments, EDA system 1900 is a general purpose computing device including a hardware processor 1902 and a non-transitory, computer-readable storage medium 1904. Storage medium 1904, amongst other things, is encoded with, i.e., stores, computer program code (instructions) 1906, i.e., a set of executable instructions. Execution of instructions 1906 by hardware processor 1902 represents (at least in part) an EDA tool which implements a portion or all of, e.g., the methods 300 and 300'.

The processor 1902 is electrically coupled to computer-readable storage medium 1904 via a bus 1908. The processor 1902 is also electrically coupled to an I/O interface 1910 and a fabrication tool 1916 by bus 1908. A network interface 1912 is also electrically connected to processor 1902 via bus 1908. Network interface 1912 is connected to a network 1914, so that processor 1902 and computer-readable storage medium 1904 are capable of connecting to external elements via network 1914. The processor 1902 is configured to execute computer program code 1906 encoded in computer-readable storage medium 1904 in order to cause EDA system 1900 to be usable for performing a portion or all of the noted processes and/or methods. In one or more embodiments, processor 1902 is a central processing unit (CPU), a multi-processor, a distributed processing system, an application specific integrated circuit (ASIC), and/or a suitable processing unit.

In one or more embodiments, computer-readable storage medium 1904 is an electronic, magnetic, optical, electro-magnetic, infrared, and/or a semiconductor system (or apparatus or device). For example, computer-readable storage medium 1904 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1904 includes a compact disk-read only memory (CD-ROM), a compact disk-read/write (CD-R/W), and/or a digital video disc (DVD).

In one or more embodiments, storage medium 1904 stores computer program code 1906 configured to cause EDA system 1900 (where such execution represents (at least in part) the EDA tool) to be usable for performing a portion or all of the noted processes and/or methods. In one or more embodiments, storage medium 1904 also stores information which facilitates performing a portion or all of the noted processes and/or methods. In one or more embodiments, storage medium 1904 stores library 1920 of IC layout diagram of standard cells including such standard cells as disclosed herein, for example, a cell including in the cells discussed above with respect to FIGS. 4A-11 and FIGS. 13-18.

EDA system 1900 includes I/O interface 1910. I/O interface 1910 is coupled to external circuitry. In one or more embodiments, I/O interface 1910 includes a keyboard, keypad, mouse, trackball, trackpad, touchscreen, and/or cursor direction keys for communicating information and commands to processor 1902.

EDA system 1900 also includes network interface 1912 coupled to processor 1902. Network interface 1912 allows EDA system 1900 to communicate with network 1914, to which one or more other computer systems are connected. Network interface 1912 includes wireless network interfaces such as BLUETOOTH, WIFI, WIMAX, GPRS, or WCDMA; or wired network interfaces such as ETHERNET, USB, or IEEE-1964. In one or more embodiments, a portion or all of noted processes and/or methods, is implemented in two or more systems 1900.

EDA system 1900 also includes the fabrication tool(s) 1916 coupled to processor 1902. The fabrication tools 1916 are configured to fabricate integrated circuits, e.g., the integrated circuits including cell including in the cells discussed above with respect to FIGS. 4A-11 and FIGS. 13-18, according to the design files processed by the processor 1902. In some embodiments, the fabrication tools 1916 perform various semiconductor processes including, for example, generating photomasks based on layouts, fabricating using the photomasks, etching, deposition, implantation, and annealing. The fabrication tools 1916 include, for example, photolithography steppers, etch tools, deposition tools, polishing tools, rapid thermal anneal tools, ion implantation tools, and the like. Each fabrication tool 1916 modifies the wafer according to a particular operating recipe. For illustration, one fabrication tool 1916 is configured to deposit a film having a certain thickness on a wafer, and another fabrication tool 1916 is configured to etch away a layer from a wafer. Furthermore, in some embodiments, the fabrication tools 1916 of the same type are designed to perform the same type of process.

EDA system 1900 is configured to receive information through I/O interface 1910. The information received through I/O interface 1910 includes one or more of instructions, data, design rules, libraries of standard cells, and/or other parameters for processing by processor 1902. The information is transferred to processor 1902 via bus 1908. EDA system 1900 is configured to receive information related to a UI through I/O interface 1910. The information is stored in computer-readable medium 1904 as design specification 1922.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1900. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 20:
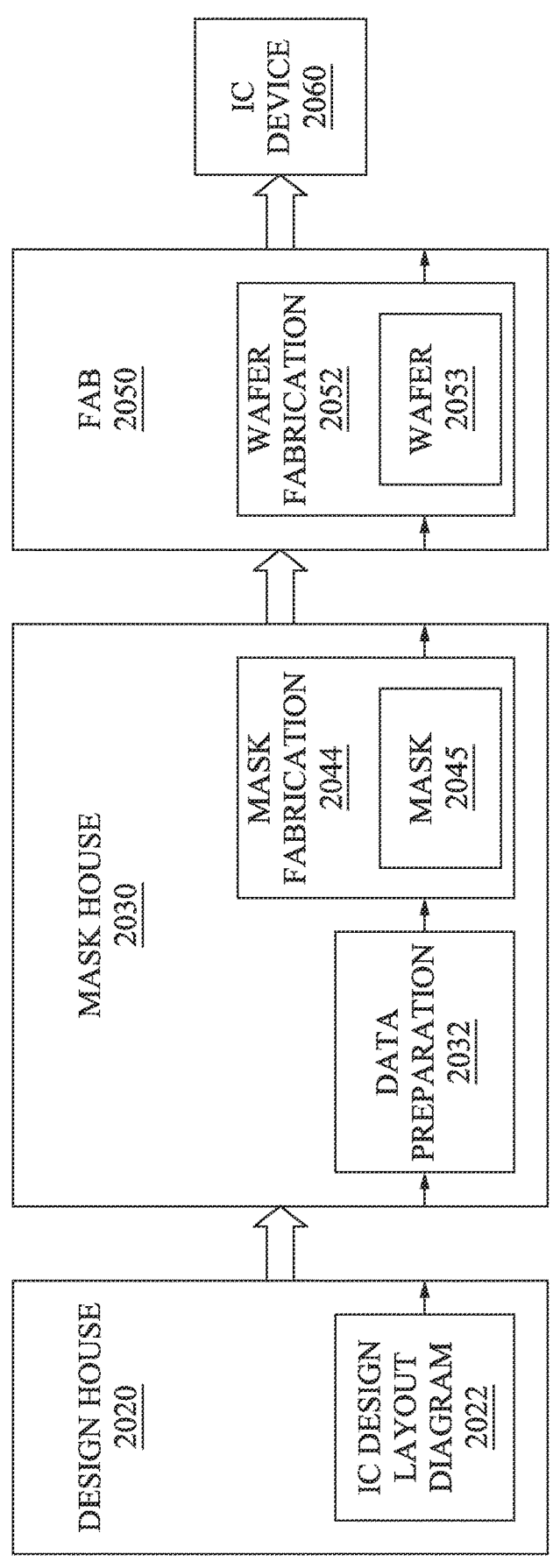
FIG. 20 is a block diagram of an integrated circuit manufacturing system, and an integrated circuit manufacturing flow associated therewith, in accordance with some embodiments.

FIG. 20 is a block diagram of IC manufacturing system 2000, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 2000.

In FIG. 20, IC manufacturing system 2000 includes entities, such as a design house 2020, a mask house 2030, and an IC manufacturer/fabricator ("fab") 2050, that interact with one another in the design, development, and manufacturing cycles and/or services related to manufacturing an IC device 2060. The entities in IC manufacturing system 2000 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 2020, mask house 2030, and IC fab 2050 is owned by a single larger company. In some embodiments, two or more of design house 2020, mask house 2030, and IC fab 2050 coexist in a common facility and use common resources.

Design house (or design team) 2020 generates an IC design layout diagram 2022. IC design layout diagram 2022 includes various geometrical patterns, for example, an IC layout design depicted in FIGS. 1-18, designed for an IC device 2060, for example, the integrated circuits discussed above with respect to FIGS. 1-18. The geometrical patterns correspond to patterns of metal, oxide, or semiconductor layers that make up the various components of IC device 2060 to be fabricated. The various layers combine to form various IC features. For example, a portion of IC design layout diagram 2022 includes various IC features, such as an active region, gate electrode, source and drain, conductive segments or vias of an interlayer interconnection, to be formed in a semiconductor substrate (such as a silicon wafer) and various material layers disposed on the semiconductor substrate. Design house 2020 implements a proper design procedure to form IC design layout diagram 2022. The design procedure includes one or more of logic design, physical design or place and route. IC design layout diagram 2022 is presented in one or more data files having information of the geometrical patterns. For example, IC design layout diagram 2022 can be expressed in a GDSII file format or DFII file format.

Mask house 2030 includes data preparation 2032 and mask fabrication 2044. Mask house 2030 uses IC design layout diagram 2022 to manufacture one or more masks 2045 to be used for fabricating the various layers of IC device 2060 according to IC design layout diagram 2022. Mask house 2030 performs mask data preparation 2032, where IC design layout diagram 2022 is translated into a representative data file ("RDF"). Mask data preparation 2032 provides the RDF to mask fabrication 2044. Mask fabrication 2044 includes a mask writer. A mask writer converts the RDF to an image on a substrate, such as a mask (reticle) 2045 or a semiconductor wafer 2053. The IC design layout diagram 2022 is manipulated by mask data preparation 2032 to comply with particular characteristics of the mask writer and/or requirements of IC fab 2050. In FIG. 20, data preparation 2032 and mask fabrication 2044 are illustrated as separate elements. In some embodiments, data preparation 2032 and mask fabrication 2044 can be collectively referred to as mask data preparation.

In some embodiments, data preparation 2032 includes optical proximity correction (OPC) which uses lithography enhancement techniques to compensate for image errors, such as those that can arise from diffraction, interference, other process effects and the like. OPC adjusts IC design layout diagram 2022. In some embodiments, data preparation 2032 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 2032 includes a mask rule checker (MRC) that checks the IC design layout diagram 2022 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 2022 to compensate for limitations during mask fabrication 2044, which may undo part of the modifications performed by OPC in order to meet mask creation rules.

In some embodiments, data preparation 2032 includes lithography process checking (LPC) that simulates processing that will be implemented by IC fab 2050 to fabricate IC device 2060. LPC simulates this processing based on IC design layout diagram 2022 to create a simulated manufactured device, such as IC device 2060. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 2022.

It should be understood that the above description of data preparation 2032 has been simplified for the purposes of clarity. In some embodiments, data preparation 2032 includes additional features such as a logic operation (LOP) to modify the IC design layout diagram 2022 according to manufacturing rules. Additionally, the processes applied to IC design layout diagram 2022 during data preparation 2032 may be executed in a variety of different orders.

After data preparation 2032 and during mask fabrication 2044, a mask 2045 or a group of masks 2045 are fabricated based on the modified IC design layout diagram 2022. In some embodiments, mask fabrication 2044 includes performing one or more lithographic exposures based on IC design layout diagram 2022. In some embodiments, an electron-beam (e-beam) or a mechanism of multiple e-beams is used to form a pattern on a mask (photomask or reticle) 2045 based on the modified IC design layout diagram 2022. Mask 2045 can be formed in various technologies. In some embodiments, mask 2045 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 2045 includes a transparent substrate (for example, fused quartz) and an opaque material (for example, chromium) coated in the opaque regions of the binary mask. In another example, mask 2045 is formed using a phase shift technology. In a phase shift mask (PSM) version of mask 2045, various features in the pattern formed on the phase shift mask are configured to have proper phase difference to enhance the resolution and imaging quality. In various examples, the phase shift mask can be attenuated PSM or alternating PSM. The mask(s) generated by mask fabrication 2044 is used in a variety of processes. For example, such a mask(s) is used in an ion implantation process to form various doped regions in semiconductor wafer 2053, in an etching process to form various etching regions in semiconductor wafer 2053, and/or in other suitable processes.

IC fab 2050 includes wafer fabrication 2052. IC fab 2050 is an IC fabrication business that includes one or more manufacturing facilities for the fabrication of a variety of different IC products. In some embodiments, IC Fab 2050 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 2050 uses mask(s) 2045 fabricated by mask house 2030 to fabricate IC device 2060. Thus, IC fab 2050 at least indirectly uses IC design layout diagram 2022 to fabricate IC device 2060. In some embodiments, semiconductor wafer 2053 is fabricated by IC fab 2050 using mask(s) 2045 to form IC device 2060. In some embodiments, the IC fabrication includes performing one or more lithographic exposures based at least indirectly on IC design layout diagram 2022. Semiconductor wafer 2053 includes a silicon substrate or other proper substrate having material layers formed thereon. Semiconductor wafer 2053 further includes one or more of various doped regions, dielectric features, multi-level interconnects, and the like (formed at subsequent manufacturing steps).

As described above, the present application provides an integrated circuit having cells and method of manufacturing the same to optimize M1 metal lines defining and placement. By placing M1 metal lines staggered in various rows in the floorplan, the short between two opposite M1 metal lines is avoid. Accordingly, reliability and efficiency of cell placement of the integrated circuit are improved.

In some embodiments, a method is provided, including following operations: obtaining information on gate pitch and a ratio between the gate pitch and a first metal line pitch; comparing a preset metal line end spacing with a second metal line pitch, of multiple metal traces, and a spacing between a metal line layer and a power rail layer; in response to the comparison, defining multiple first metal line patterns overlapping multiple first gate patterns and defining multiple second metal line patterns disposed between two adjacent gate patterns in multiple second gate patterns; placing the first metal line patterns in a first row in a floorplan of an integrated circuit layout design and the second metal line patterns in a second row, adjacent the first row; and manufacturing at least one element in an integrated circuit based on the integrated circuit layout design.

In some embodiments, a system is provided. The system includes a non-transitory computer readable medium for storing instructions thereon and a processor connected to the non-transitory computer readable medium. The processor is configured to execute the instructions for obtaining information on gate pitch, a ratio between the gate pitch and a metal line pitch, and a set of design rules of a layout design; creating a floorplan having multiple first rows and multiple second rows that are interlaced with each other; generating a first cell and a second cell that correspond to a first circuit and have a first cell height, generating a third cell having a second cell height double the first cell height, and placing the first cell in a first row of the second rows, and placing the second cell in a first row of the second rows, and placing the third cell in one of the first rows and a row, adjacent to the one of the first rows, of the second rows. Generating a first cell and a second cell includes assigning a first line in multiple first metal line patterns overlapping multiple gate patterns to the first cell; and assigning a first line in multiple second metal line patterns overlapping multiple conductive segment patterns to the second cell. Generating a third cell includes assigning a second line, having a length greater than the first cell height, in the first metal line patterns and a second line in the second metal line patterns to the third cell. The set of design rules of the layout design includes a first line end spacing between a boundary of the one in the second rows and an end of the second line in the first metal line patterns.

In some embodiments, a method of manufacturing an integrated circuit is provided, including following operations: forming a first metal layer by a first mask, wherein the first metal layer comprises multiple first metal lines extending from corresponding ones in multiple first rows to corresponding ones in multiple second rows that are interlaced with the first rows; and forming a second metal layer by a second mask, wherein the second metal layer comprises multiple second metal lines extending from the corresponding ones in the second rows to corresponding ones in multiple first rows. Ends of the first metal lines in the corresponding ones in the second rows are apart from first boundaries of the corresponding ones in the second rows by a distance larger or equal to a first metal line end spacing, in which the first metal lines cross second boundaries, opposited to the first boundaries, of the corresponding ones in the second rows. Ends of the second metal lines in the corresponding ones in the first rows are apart from first boundaries of the corresponding ones in the first rows by a distance larger or equal to a second metal line end spacing, in which the second metal lines cross the second boundaries of the corresponding ones in the second rows. The plurality of first metal lines and the second metal lines have a metal line pitch is half of a gate pitch of the integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

obtaining, by a processor, information on gate pitch and a ratio between the gate pitch and a first metal line pitch;

comparing, by the processor, a preset metal line end spacing with a second metal line pitch, of a plurality of metal traces, and a spacing between a metal line layer and a power rail layer;

in response to the comparison, defining, by the processor, a plurality of first metal line patterns, overlapping a plurality of first gate patterns, for formation by a first mask and defining a plurality of second metal line patterns, disposed between two adjacent gate patterns in a plurality of second gate patterns, for formation by a second mask;

placing, by the processor, the plurality of first metal line patterns in a first row in a floorplan of an integrated circuit layout design and the plurality of second metal line patterns in a second row, adjacent the first row; and manufacturing, by at least one fabrication tool, at least one element in an integrated circuit based on the integrated circuit layout design, wherein manufacturing, by the at least one fabrication tool, the at least one element comprises:

forming in a same metal layer, by a first mask and a second mask for the same metal layer, a plurality of first metal lines corresponding to the plurality of first metal line patterns and a plurality of second metal lines corresponding to the plurality of second metal line patterns, respectively.

2. The method of claim 1, wherein the ratio between gate pitch and the first metal line pitch is 1:1 or 2:1.

3. The method of claim 1, wherein one of the plurality of second metal line patterns overlaps a conductive segment pattern and corresponds to an output terminal of a logic circuit cell.

4. The method of claim 3, wherein lengths of the plurality of first metal line patterns and the plurality of second metal line patterns are less than 1.1 times of a cell height of the logic circuit cell.

5. The method of claim 1, wherein defining, by the processor, the plurality of first metal line patterns comprises:

defining a first line of the plurality of first metal line patterns having a first length larger than a row height of the first row;

wherein placing the plurality of first metal line patterns in the first row comprises:

placing an end of the first line in the plurality of first metal line patterns apart from a boundary of the second row by a distance at least larger than or equal to a first line end spacing.

6. The method of claim 5, wherein defining, by the processor, the plurality of second metal line patterns comprises:

defining a first line of the plurality of second metal line patterns having a second larger than a row height of the second row;

wherein placing the plurality of second metal line patterns in the second row comprises:

placing an end of the first line of the plurality of second metal line patterns apart from a first boundary of the first row by a distance at least larger than or equal to a second line end spacing while a second boundary of the first row passes across the first line of the plurality of second metal line patterns.

7. The method of claim 6, wherein the first and second line end spacings are different from each other.

8. The method of claim 1, further comprising:

defining, by the processor, a third metal line pattern with respect to the plurality of second metal line patterns; and placing the third metal line patterns in the first row, wherein the plurality of first metal line patterns, the plurality of second metal line patterns, the third metal line pattern, the plurality of first gate patterns, and the plurality of second gate patterns extend in a same direction.

9. The method of claim 8, further comprising:

defining, by the processor, a fourth metal line pattern configured with respect to the plurality of second metal line patterns; and placing, by the processor, the fourth metal line pattern, having a length M1LB, in a third row, wherein the first to third rows, having a row height RH, interlaced with each other and the first row is interposed between the second and third rows, wherein a first line of the plurality of second metal line pattern and the third to fourth metal line patterns are placed within a same gate pitch, wherein the row height RH satisfies mathematical relationship (1) and (2):

$$3 \times RH > 3 \times M1LB + 4 \times EE \qquad (1)$$

$$RH + P\_M0 + S\_M0 \geq M1LB + 2 \times EE \qquad (2)$$

wherein EE corresponds to a line end spacing, between the third to fourth metal line patterns, equal to a line end spacing between the third metal line pattern and the first line of the plurality of second metal line patterns, P_M0 corresponds to the second metal line pitch of the plurality of metal traces placed in a layer below the first line of the plurality of second metal line patterns and the third to fourth metal line patterns, and S_M0 corresponds to a spacing between two adjacent traces in the plurality of metal traces.

10. A method, comprising:

obtaining, by the processor, information on gate pitch, a ratio between the gate pitch and a metal line pitch, and a set of design rules of a layout design;

creating, by the processor, a floorplan having a plurality of first rows and a plurality of second rows that are interlaced with each other;

generating, by the processor, a first cell and a second cell that correspond to a first circuit and have a first cell height, comprising:

assigning a first line in a plurality of first metal line patterns, overlapping a plurality of gate patterns and for formation by a first mask, to the first cell; and assigning a first line in a plurality of second metal line patterns, overlapping a plurality of conductive segment patterns and for formation by a second mask, to the second cell;

generating, by the processor, a third cell having a second cell height double the first cell height, comprising:

assigning a second line, having a length greater than the first cell height, in the plurality of first metal line patterns and a second line in the plurality of second metal line patterns to the third cell;

placing, by the processor, the first cell in a first row of the plurality of first rows and the second cell in a first row of the plurality of second rows, and placing, by the processor, the third cell in one of the plurality of first rows and a row, adjacent to the one of the plurality of first rows, of the plurality of second rows, wherein the set of design rules of the layout design includes a first line end spacing between a boundary of the one in the plurality of second rows and an end of the second line in the plurality of first metal line patterns; and manufacturing, by at least one fabrication tool, at least one element in an integrated circuit based on the layout design, wherein manufacturing, by the at least one fabrication tool, the at least one element comprises:

forming in a same metal layer, by a first mask and a second mask for the same metal layer, a plurality of first metal lines corresponding to the plurality of first metal line patterns and a plurality of second metal lines corresponding to the plurality of second metal line patterns, respectively.

11. The method of claim 10, wherein the second line in the plurality of first metal line patterns and the second line in the plurality of second metal line patterns correspond to internal metal lines or metal lines configured to receive signals for the first and second cells.

12. The method of claim 11, wherein the first cell height is smaller than about 110 nanometers, and the gate pitch is larger than about 44 nanometers.

13. The method of claim 10, wherein the set of design rules of the layout design further includes none of the plurality of first metal line patterns in the second cell and none of the plurality of second metal line patterns in the first cell.

14. The method of claim 10, wherein generating, by the processor, the first cell further comprises:

assigning a third line in the plurality of second metal line patterns to the first cell, wherein the third line in the plurality of second metal line patterns is coupled to a first line in a plurality of third metal line patterns in the first cell that are in a layer below the plurality of first metal line patterns and the plurality of second metal line patterns.

15. The method of claim 10, wherein the set of design rules of the layout design includes a second line end spacing between a boundary of the one in the plurality of first rows and an end of the second line in the plurality of second metal line patterns, wherein the second line in the plurality of second metal line patterns extends from the one in the plurality of second rows to the one in the plurality of first rows.

16. A method, comprising:

obtaining, by the processor, information for an integrated circuit layout design;

comparing by the processor, based on the information, a preset metal line end spacing with a first metal line pitch, of a plurality of metal traces, and a spacing between a metal line layer and a power rail layer;

in response to the comparison, defining, by the processor, a plurality of first metal line patterns, overlapping a plurality of first gate patterns, for formation by a first mask and defining, by the processor, a plurality of second metal line patterns, disposed between two adjacent gate patterns in a plurality of second gate patterns, for formation by a second mask;

placing, by the processor, the plurality of first metal line patterns in a first row in a floorplan of the integrated circuit layout design and the plurality of second metal line patterns in a second row; and manufacturing, by at least one fabrication tool, at least one element in an integrated circuit based on the integrated circuit layout design, wherein manufacturing, by the at least one fabrication tool, the at least one element comprises:

forming in a same metal layer, by a first mask and a second mask for the same metal layer, a plurality of first metal lines corresponding to the plurality of first metal line patterns and a plurality of second metal lines corresponding to the plurality of second metal line patterns, respectively, wherein a first line of the plurality of first metal lines and a second line of plurality of second metal lines are staggered in two adjacent rows.

17. The method of claim 16, wherein defining, by the processor, the plurality of first metal line patterns comprises:

defining a first line of the plurality of first metal line patterns having a first length larger than a row height of the first row.

18. The method of claim 17, wherein placing, by the processor, the plurality of first metal line patterns in the first row comprises:

placing an end of the first line in the plurality of first metal line patterns apart from a boundary of the second row by a distance at least larger than or equal to a first line end spacing.

19. The method of claim 15, wherein the first and second line end spacings are different from each other.

20. The method of claim 16, wherein an end of the first line apart from a boundary of the second row by a first distance, and an end of the second line apart from a boundary of the first row by a second distance different from the first distance.

* * * * *